US012633495B2

(12) United States Patent     (10) Patent No.:   US 12,633,495 B2

Fang et al.     (45) Date of Patent:   May 19, 2026

(54) SEM IMAGE ENHANCEMENT METHODS AND SYSTEMS

(71) Applicant: ASML Netherlands B.V., AH Veldhoven (NL)

(72) Inventors: Wei Fang, Milpitas, CA (US); Lingling Pu, San Jose, CA (US); Thomas Jarik Huisman, Eindhoven (NL); Erwin Paul Smakman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 327 days.

(21) Appl. No.: 16/508,087

(22) Filed: Jul. 10, 2019

(65) Prior Publication Data

US 2020/0018944 A1     Jan. 16, 2020

Related U.S. Application Data

(60) Provisional application No. 62/786,942, filed on Dec. 31, 2018, provisional application No. 62/697,927, filed on Jul. 13, 2018.

(51) Int. Cl.
    *G06T 5/70*       (2024.01)
    *G02B 21/00*     (2006.01)
    (Continued)

(52) U.S. Cl.
    CPC .......... *H01J 37/222* (2013.01); *G02B 21/008* (2013.01); *G02B 21/365* (2013.01);
    (Continued)

(58) Field of Classification Search
    CPC ............................ G02B 21/365; G02B 17/084; G02B 17/0824; G02B 21/008; G02B 21/36;
    (Continued)

(56) References Cited

U.S. PATENT DOCUMENTS

| | | |
|---|---|---|
| 5,247,588 A | 9/1993 | Komatsu |
| 5,715,334 A | 2/1998 | Peters |

(Continued)

FOREIGN PATENT DOCUMENTS

| | | |
|---|---|---|
| CN | 105023240 A | 11/2015 |
| CN | 108475417 A | 8/2018 |

(Continued)

OTHER PUBLICATIONS

Faridian et al. Nanoscale imaging using deep ultraviolet digital holographic microscopy Optics Express Jun. 21, 2010 /vol. 18 No. 13 (Year: 2010).*

(Continued)

*Primary Examiner* — Kenny A Cese

(74) *Attorney, Agent, or Firm* — FINNEGAN, HENDERSON, FARABOW, GARRETT & DUNNER, LLP

(57) ABSTRACT

Systems and methods for image enhancement are disclosed. A method for enhancing an image may include acquiring a first scanning electron microscopy (SEM) image at a first resolution. The method may also include acquiring a second SEM image at a second resolution. The method may further include providing an enhanced image by using the first SEM image as a reference to enhance the second SEM image. The enhanced image may be provided by using one or more features extracted from the first image to enhance the second SEM image, or using the first SEM image as a reference to numerically enhance the second SEM image.

17 Claims, 10 Drawing Sheets

(51) Int. Cl.

| | |
|---|---|
| *G02B 21/36* | (2006.01) |
| *G06N 20/00* | (2019.01) |
| *G06T 5/50* | (2006.01) |
| *G06T 7/00* | (2017.01) |
| *G06V 10/44* | (2022.01) |
| *G06V 10/82* | (2022.01) |
| *G06V 20/69* | (2022.01) |
| *H01J 37/22* | (2006.01) |

(52) U.S. Cl.
CPC .............. *G06N 20/00* (2019.01); *G06T 5/50*
(2013.01); *G06T 7/0002* (2013.01); *G06V*
*10/454* (2022.01); *G06V 10/82* (2022.01);
*G06V 20/695* (2022.01); *G06T 2207/10061*
(2013.01); *G06T 2207/20081* (2013.01)

(58) Field of Classification Search
CPC ...... G06N 20/00; G06N 3/088; G06K 9/0014;
G06T 5/50; G06T 7/0002; G06T
2207/10061; G06T 2207/30148; G06T
5/70
See application file for complete search history.

(56) References Cited

U.S. PATENT DOCUMENTS

| | | | |
|---|---|---|---|
| 6,201,240 B1 | | 3/2001 | Dotan et al. |
| 6,768,543 B1* | | 7/2004 | Aiyer ................... G01N 21/956 |
| | | | 356/237.4 |
| 6,812,462 B1* | | 11/2004 | Toth ........................ H01J 37/28 |
| | | | 850/1 |
| 8,045,145 B1* | | 10/2011 | Bakker ............ G01N 21/95607 |
| | | | 356/237.1 |
| 10,169,852 B1 | | 1/2019 | Putman et al. |
| 2004/0000640 A1* | | 1/2004 | Kazumori ............... H01J 37/28 |
| | | | 250/310 |
| 2004/0183014 A1* | | 9/2004 | Kagawa .................. H01J 37/28 |
| | | | 250/310 |
| 2005/0214958 A1* | | 9/2005 | Nakasuji ................. H01J 37/28 |
| | | | 438/14 |
| 2005/0263702 A1* | | 12/2005 | Agemura ............. G01R 31/307 |
| | | | 250/310 |
| 2006/0097166 A1* | | 5/2006 | Ishitani ................... H01J 37/26 |
| | | | 250/310 |
| 2008/0006771 A1* | | 1/2008 | Tseng ...................... H01J 37/28 |
| | | | 250/307 |
| 2008/0310704 A1 | | 12/2008 | Tachibana et al. |
| 2009/0020698 A1* | | 1/2009 | Muto .................. H01J 37/3056 |
| | | | 250/310 |
| 2009/0322973 A1* | | 12/2009 | Ito ........................ H01J 37/1478 |
| | | | 349/15 |
| 2010/0081217 A1* | | 4/2010 | Nagano ................... H01J 37/28 |
| | | | 438/5 |
| 2010/0091362 A1 | | 4/2010 | Isozaki et al. |
| 2010/0163728 A1 | | 7/2010 | Ohtomo et al. |
| 2010/0183217 A1 | | 7/2010 | Seung et al. |
| 2011/0187847 A1 | | 8/2011 | Bai et al. |
| 2012/0320455 A1* | | 12/2012 | Goruganthu ........... G01N 21/47 |
| | | | 359/386 |
| 2013/0248735 A1* | | 9/2013 | Man ...................... H01J 37/023 |
| | | | 250/442.11 |
| 2013/0335817 A1 | | 12/2013 | Isobe et al. |
| 2014/0007308 A1* | | 1/2014 | Reuter ................... G01Q 70/10 |
| | | | 850/40 |

| | | | |
|---|---|---|---|
| 2014/0301630 A1* | | 10/2014 | Kulkarni et al. |
| 2015/0034824 A1* | | 2/2015 | Mori ....................... H01J 37/28 |
| | | | 250/310 |
| 2015/0243474 A1* | | 8/2015 | Lazic ...................... H01J 37/28 |
| | | | 250/311 |
| 2016/0268096 A1 | | 9/2016 | Ren et al. |
| 2016/0290934 A1* | | 10/2016 | Wells ..................... G06T 7/001 |
| 2016/0300690 A1* | | 10/2016 | Ikegami ................ H01J 37/147 |
| 2017/0045722 A1* | | 2/2017 | Fretel ................. G02B 21/0048 |
| 2017/0193680 A1 | | 7/2017 | Zhang et al. |
| 2017/0194126 A1 | | 7/2017 | Bhaskar et al. |
| 2017/0200260 A1* | | 7/2017 | Bhaskar ............... G06T 7/0004 |
| 2017/0200265 A1 | | 7/2017 | Bhaskar et al. |
| 2017/0213355 A1 | | 7/2017 | Hujsak et al. |
| 2017/0345140 A1* | | 11/2017 | Zhang .................. G06K 9/6271 |
| 2018/0065844 A1* | | 3/2018 | Imhoff ............... B81C 1/00619 |
| 2018/0113292 A1* | | 4/2018 | Novikau ........... G02B 21/0076 |
| 2018/0149603 A1* | | 5/2018 | Bhattacharyya ..... G01R 31/311 |
| 2018/0217065 A1* | | 8/2018 | Haller .................... G01N 21/65 |
| 2018/0308659 A1* | | 10/2018 | Yamazawa ............. H01J 37/22 |
| 2018/0342045 A1 | | 11/2018 | Lutz et al. |
| 2018/0365535 A1 | | 12/2018 | Gesley et al. |
| 2019/0005629 A1* | | 1/2019 | Sharma ................. G06T 3/4046 |
| 2019/0087939 A1* | | 3/2019 | Hakimuddin ........... G06T 5/001 |
| 2019/0172675 A1* | | 6/2019 | Masnaghetti ........... H01J 37/28 |
| 2019/0294055 A1 | | 9/2019 | Huisman et al. |
| 2019/0333199 A1* | | 10/2019 | Ozcan ................... G06N 3/088 |
| 2020/0126755 A1* | | 4/2020 | Suzuki .................... H01J 37/12 |
| 2020/0411281 A1* | | 12/2020 | Yamaguchi ......... H01J 37/1478 |

FOREIGN PATENT DOCUMENTS

| | | |
|---|---|---|
| CN | 109863573 A | 6/2019 |
| KR | 10-2005-0004786 A | 1/2005 |
| KR | 10-2018-0001564 A | 1/2018 |
| NL | 2021802 A1 | 11/2018 |
| TW | 201624050 A | 7/2016 |
| TW | 201734895 A | 10/2017 |
| TW | 201816670 A | 5/2018 |
| WO | WO 2009/038838 A2 | 3/2009 |
| WO | WO 2016/176354 A1 | 11/2016 |
| WO | WO 2017/014442 A1 | 1/2017 |
| WO | WO 2017/053812 A1 | 3/2017 |

OTHER PUBLICATIONS

Dr. Yougui Liao, "Practical Electron Microscopy and Database", An
Online Book, Second Edition (Year: 2006).*
O'Quinn et al., "Image Quality Enhancement Using Machine Learn-
ing," Southeastern 2018, IEEE, XP033413124, DOI: 10.1109/
SECON.2018.8479289.
International Search Report issued by the International Searching
Authority in related PCT International Application No. PCT/EP2019/
067555, mailed Oct. 16, 2019 (5 pgs.).
Office Action issued by the Intellectual Property Office (IPO) in
related ROC (Taiwan) Patent Application No. 108124273, mailed
Mar. 13, 2020 (11 pgs.).
Office Action issued by the Intellectual Property Office of Taiwan in
related Taiwanese Patent Application No. 109133909; mailed Aug.
4, 2021 (13 pgs.).
Notification of Reason(s) for Refusal issued by the Korean Patent
Office in related Korean Patent Application No. 10-2021-7001092;
mailed Jun. 21, 2023 (14 pgs.).
Notification of Reason(ss) for Refusal issued in related Korean
Patent Application No. 10-2021-7001092; mailed Sep. 15, 2022 (8
pgs.).

* cited by examiner

300

710 Acquiring a first image and a second image

720 Analyzing data representing the first image to obtain one or more spatial-spectral characteristics 730 Applying numerical compensations to data representing the second image based on the spatial-spectral characteristics obtained 740 Obtaining an enhanced second image

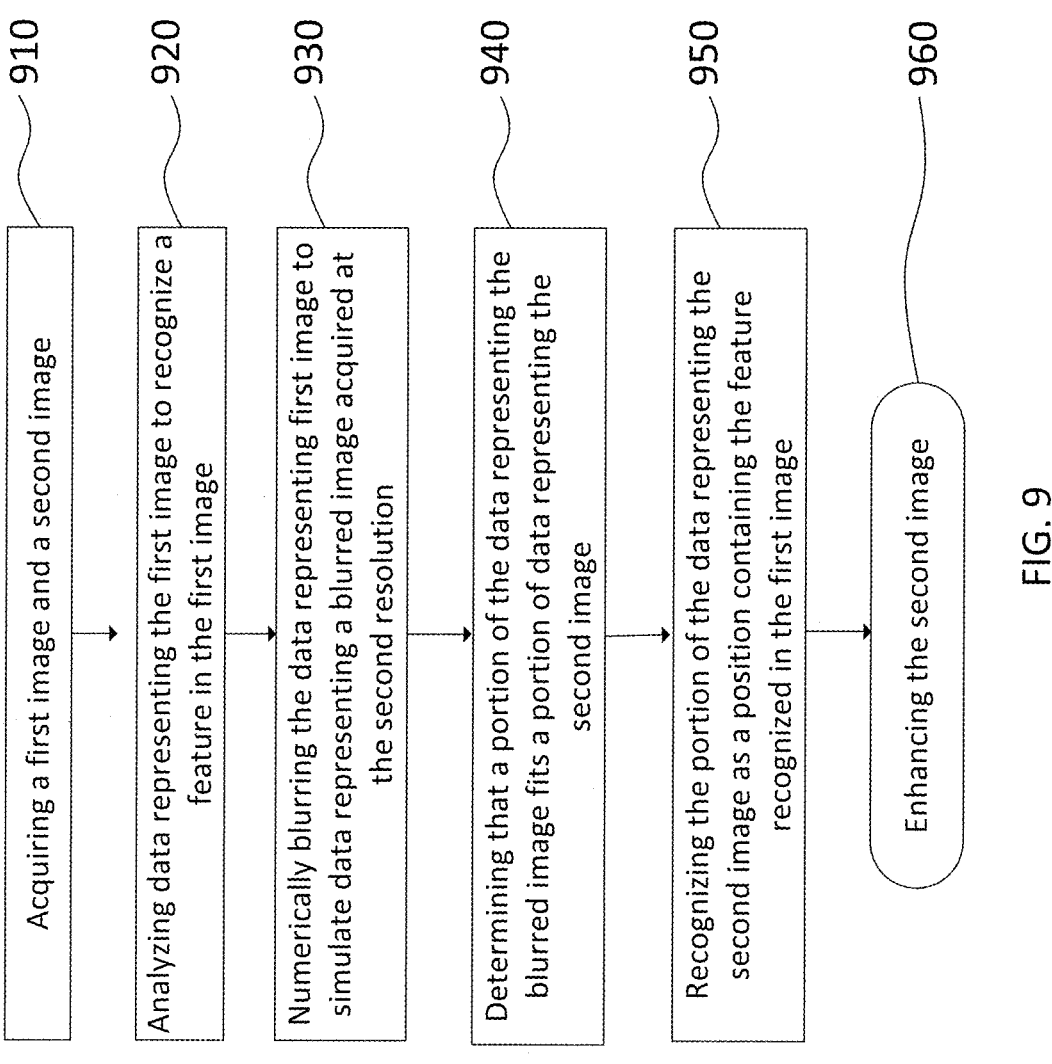

910 Acquiring a first image and a second image

920 Analyzing data representing the first image to recognize a feature in the first image 930 Numerically blurring the data representing first image to simulate data representing a blurred image acquired at the second resolution 940 Determining that a portion of the data representing the blurred image fits a portion of data representing the second image 950 Recognizing the portion of the data representing the second image as a position containing the feature recognized in the first image 960 Enhancing the second image

FIG. 9

SEM IMAGE ENHANCEMENT METHODS AND SYSTEMS

CROSS-REFERENCE TO RELATED APPLICATIONS

This application claims priority of U.S. application 62/697,927, which was filed on Jul. 13, 2018; and of U.S. application 62/786,942, which was filed on Dec. 31, 2018; both of which are incorporated herein by reference in their entireties.

FIELD

The description herein relates to the field of image enhancement, and more particularly to scanning electron microscopy (SEM) image enhancement.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. SEM delivers low energy electrons (e.g., <1 keV) to a surface and records secondary and/or backscattered electrons leaving the surface using a detector. By recording such electrons for different excitation positions on the surface, an image can be created with a spatial resolution in the order of nanometers.

As the physical sizes of IC components continue to shrink, accuracy and yield in defect detection become more and more important. However, imaging resolution and throughput of inspection tools struggles to keep pace with the ever-decreasing feature size of IC components. There are several techniques that can be used to increase throughput, including, for example, 1) reducing the amount of data averaging, 2) increasing the inspection pixel sizes, 3) increasing the beam current, and 4) using multiple beams to carry out the inspection. It is noted, however, that image qualities inevitably deteriorate when these techniques are used. Specifically, it is noted that using techniques such as reducing the amount of data averaging or increasing the inspection pixel sizes will reduce the amount of sampling, which in turn reduces image quality. Using techniques such as increasing the beam current or using multiple beams will increase spot size, which also reduces image quality. Furthermore, when multiple beams are used to carry out the inspection, the off-axis beams may suffer from resolution losses due to aberrations, further reducing image quality. Further improvements in the art are desired.

SUMMARY

Embodiments of the present disclosure provide systems and methods for image enhancement. In some embodiments, a method for enhancing an image may include acquiring a first scanning electron microscopy (SEM) image at a first resolution. The method may also include acquiring a second SEM image at a second resolution. The method may further include providing an enhanced image by using the first SEM image as a reference to enhance the second SEM image. In some embodiments, the enhanced image is provided by using one or more features extracted from the first image to enhance the second SEM image, or using the first SEM image as a reference to numerically enhance the second SEM image.

In some embodiments, an inspection system is disclosed. The inspection system may include a memory storing a set of instructions and a processor configured to execute the set of instructions. The process may execute the set of instructions to cause the inspection system to acquire a first scanning electron microscopy (SEM) image at a first resolution and acquire a second SEM image at a second resolution. The process may also execute the set of instructions to cause the inspection system to provide an enhanced image by using the first SEM image as a reference to enhance the second SEM image. In some embodiments, the enhanced image is provided by using one or more features extracted from the first image to enhance the second SEM image, or using the first SEM image as a reference to numerically enhance the second SEM image.

In some embodiments, a non-transitory computer readable medium is disclosed. The non-transitory computer readable medium may store a set of instructions that is executable by at least one processor of an apparatus to cause the apparatus to perform a method. The method may include acquiring a first scanning electron microscopy (SEM) image at a first resolution and acquiring a second SEM image at a second resolution. The method may also include providing an enhanced image by using the first SEM image as a reference to enhance the second SEM image. In some embodiments, the enhanced image is provided by using one or more features extracted from the first image to enhance the second SEM image, or using the first SEM image as a reference to numerically enhance the second SEM image.

BRIEF DESCRIPTION OF THE DRAWINGS

FIG. 9 is a flow chart illustrating an exemplary image enhancement method, consistent with embodiments of the present disclosure.

DETAILED DESCRIPTION

Figure 1:
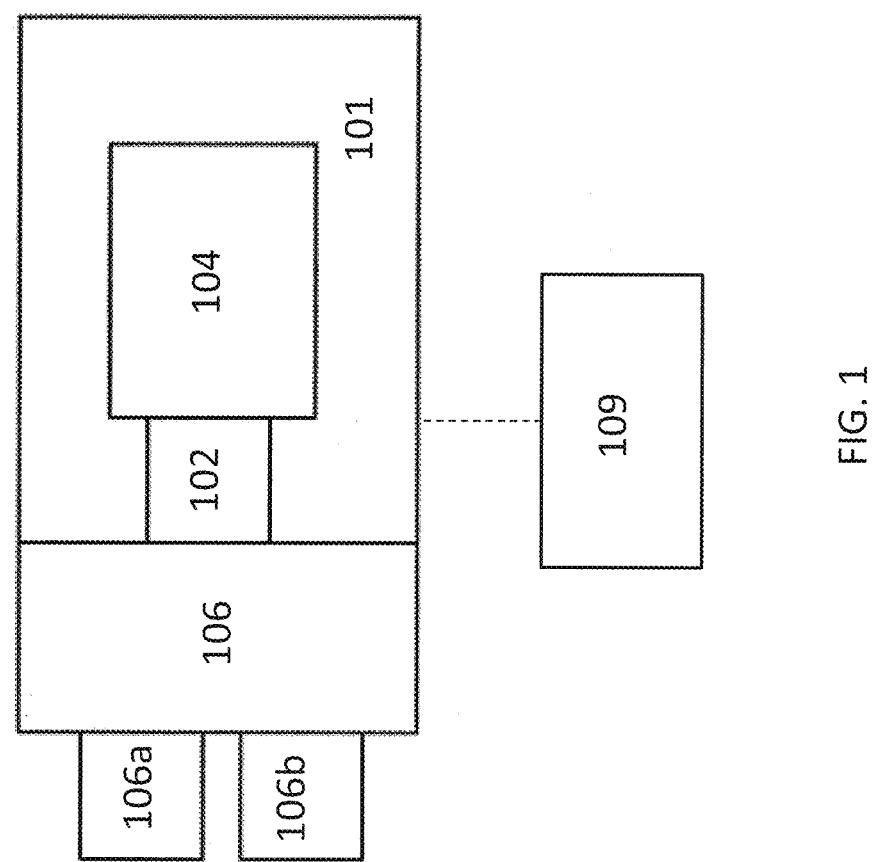
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than $\frac{1}{1000}^{th}$ of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

While high process yield is desirable in an IC chip manufacturing facility, it is also essential to maintain a high wafer throughput, defined as the number of wafers processed per hour. High process yields and high wafer throughput can be impacted by the presence of defects, especially when operator intervention is involved. Thus, detection and identification of micro and nano-sized defects by inspection tools (such as, a SEM) is essential for maintaining high yields and low cost.

In an effort to maintain a high throughput, SEM inspection tools can be often run in high throughput mode. However, SEM inspection tools operating in high throughput mode may either reduce the amount of data averaging or increase the inspection pixel size, or a combination of both, which can result in deteriorated image quality compared to images obtained in normal mode. Under high throughput mode, image enhancement and restoration become challenging, particularly because small-scale features can be severely distorted, lost, or misrepresented. On the other hand, the conventional single-image based image processing method may be inadequate because it is time consuming. Thus, further improvements in the field of defect detection and identification while maintaining high throughput and high yield is required.

Figure 4:
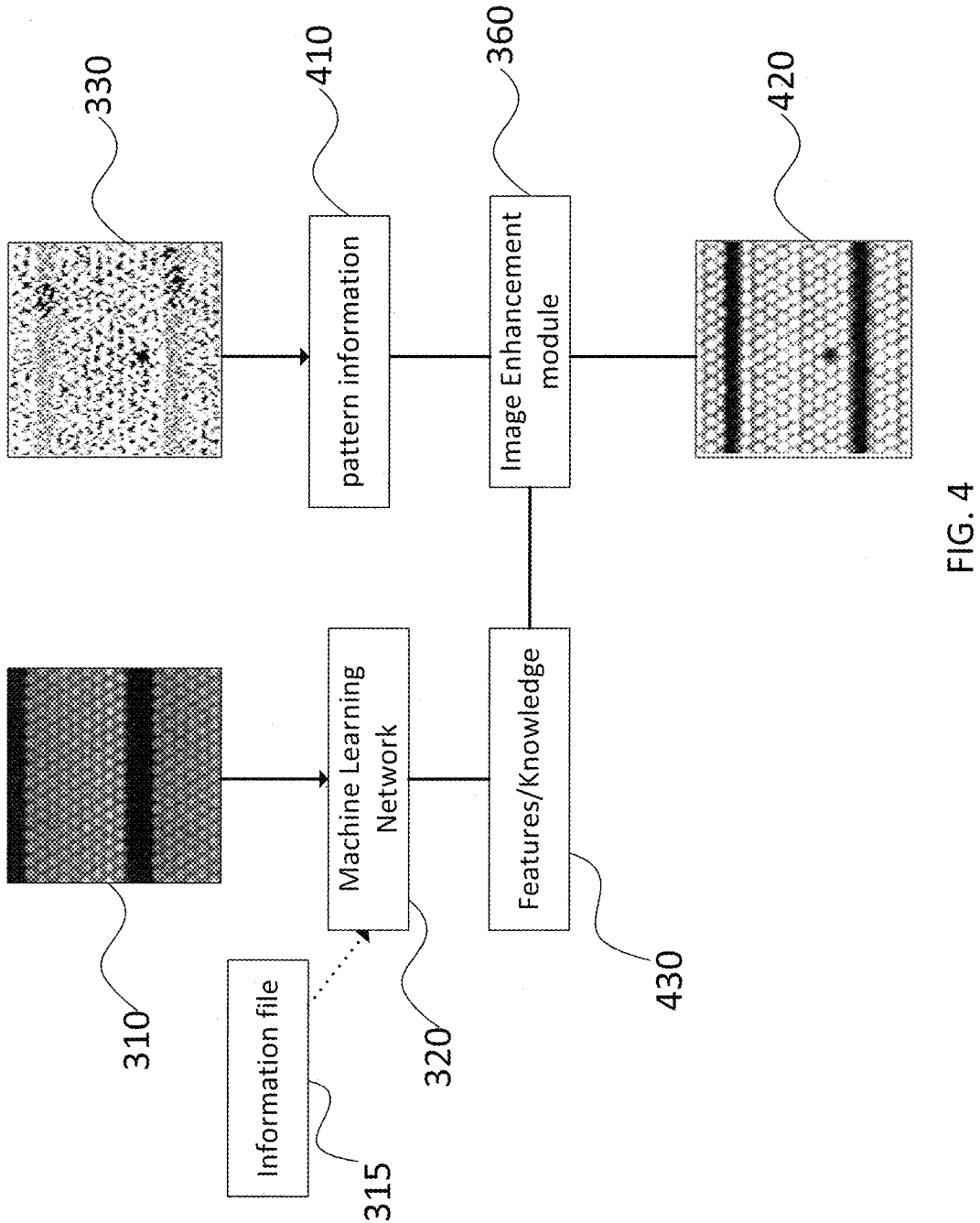
FIG. 4 is a block diagram illustrating an exemplary image enhancement system, consistent with embodiments of the present disclosure.

In one aspect of some embodiments of the present disclosure, while in high throughput mode, a SEM inspection tool may be used to acquire a low-resolution inspection image (such as a low-resolution image 330 shown in FIG. 4). Using features of the low-resolution inspection image, the inspection tool can identify one or more stored high-resolution inspection images (such as a high-resolution image 310 of FIG. 4) having similar features to enhance the acquired low-resolution image. Using the pattern information from the high-resolution inspection image, the SEM inspection tool can improve the low-resolution inspection image (such as an enhanced image 420 of FIG. 4). Thus, low-resolution inspection images may be enhanced, while maintaining the high throughput of the SEM inspection tool.

Figure 8:
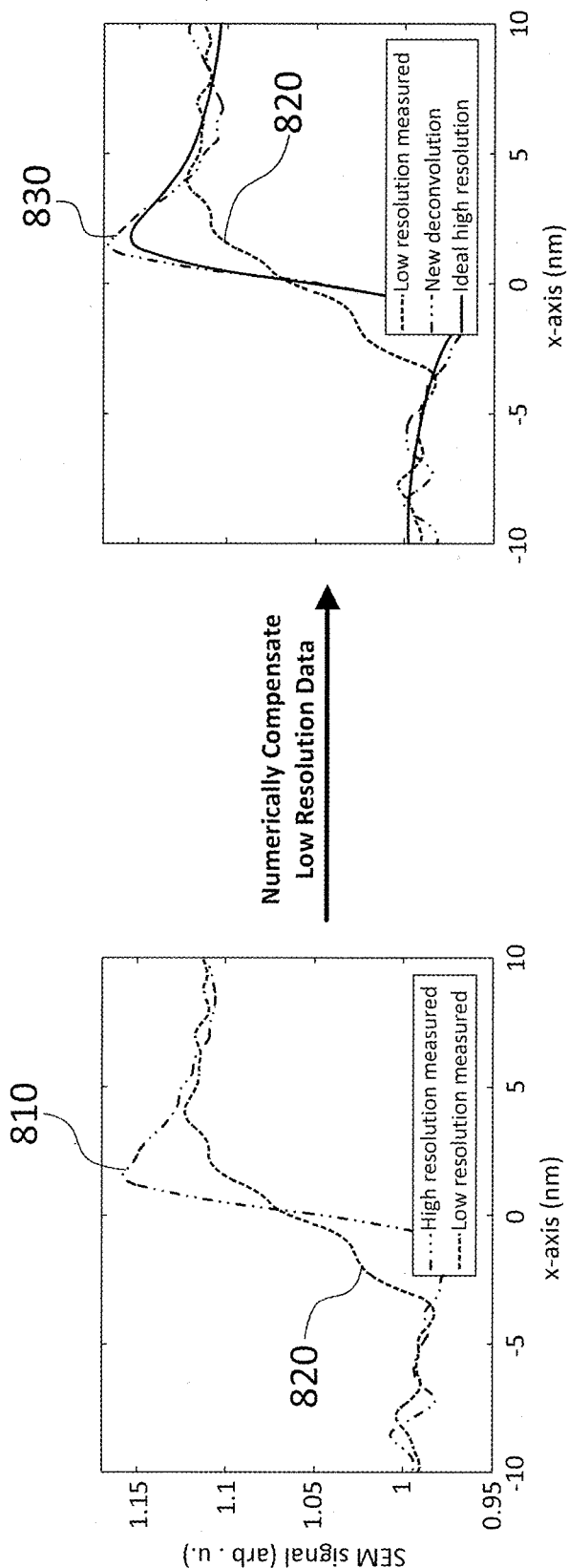
FIG. 8 is an illustration depicting an exemplary deconvolution process, consistent with embodiments of the present disclosure.

Further, some embodiments of a SEM inspection tool may be configured to analyze data representing the first SEM image (such as data 810 of FIG. 8 representing a portion of a high-resolution image) to obtain one or more spatial-spectral characteristics (e.g., phase and amplitude characteristics), which may be applied to data representing the second SEM image (such as data 820 of FIG. 8 representing a portion of a low-resolution image) to numerically enhance the second SEM image (to obtain, e.g., data 830 of FIG. 8 representing a portion of an enhanced image).

Figure 10:
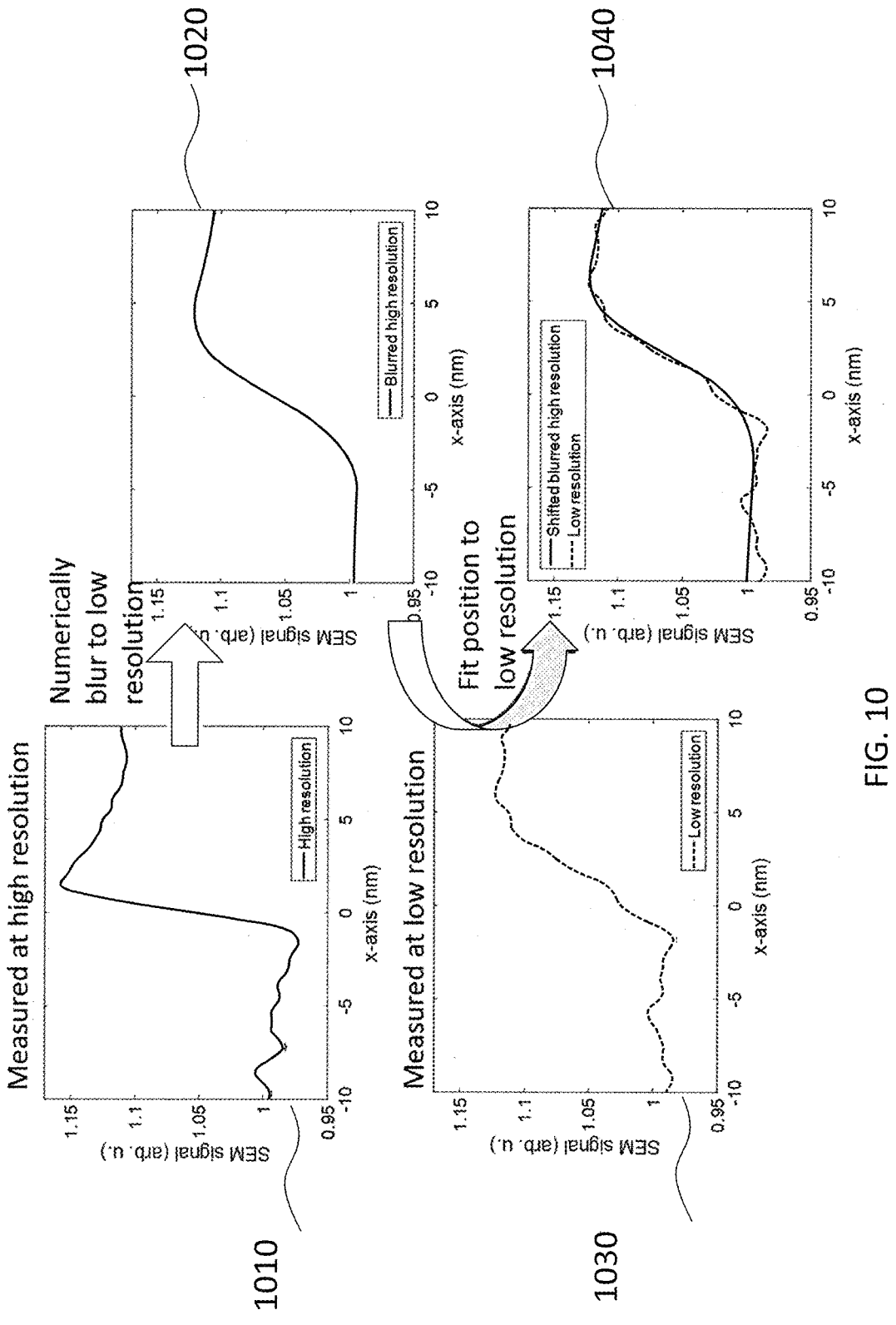
FIG. 10 is an illustration depicting an exemplary feature identification process, consistent with embodiments of the present disclosure.

The SEM inspection tool may be further configured to analyze data representing the first SEM image (such as data 1010 of FIG. 10 representing a portion of a high-resolution image) to recognize a feature in the first SEM image (e.g., an edge). The inspection tool may numerically blur the data representing first SEM image to produce simulated data (such as simulated data 1020 of FIG. 10) representing a blurred SEM image acquired at the second resolution. The inspection tool may also determine whether a portion of the simulated data representing the blurred SEM image (e.g., simulated data 1020 of FIG. 10) fits a portion of data representing the second SEM image (such as data 1030 of FIG. 10 representing a portion of a low-resolution image). If the inspection tool determines that there is a fit, the inspection tool may recognize the portion of the data representing the second SEM image as a position containing the feature (e.g., the edge) recognized in the first SEM image.

In some embodiments, the inspection tool may be configured to focus the inspection on a few features, such as edge positions and the like. In such embodiments, rather than attempting to enhance the image quality of the entire second SEM image, the inspection tool may be configured to only enhance the image quality of certain areas of interest, which may further improve its accuracy and throughput.

It is contemplated that embodiments of the present disclosure may provide a charged particle system that may be useful for charged particle imaging. The charged particle system may be applicable as a SEM inspection tool for imaging and inspecting a sample for detecting defects. A defect may refer to an abnormal condition of a component on a sample or a wafer that may lead to a failure. In some embodiments, the defect may refer to an aberration in comparison to a standard, for example, photoresist profiles, particle contamination, surface defects, etc.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

Embodiments of the present disclosure include methods and systems for enhancing SEM images. For example, a SEM inspection tool may acquire a first SEM image at a first resolution and acquire a second SEM image at a second resolution. Suppose that the second resolution is lower than the first resolution, the SEM inspection tool may utilize the first SEM image as a reference to enhance the second SEM image. In some embodiments, the enhanced image may be provided by using one or more features extracted from the first image to enhance the second SEM image. The features may be extracted using image processing and/or machine learning. Alternatively or additionally, the enhanced image may be provided by using the first SEM image as a reference to numerically enhance and restore the second SEM image.

Reference is now made to FIG. 1, which illustrates an exemplary electron beam inspection (EBI) system 100 consistent with embodiments of the present disclosure. EBI system 100 may be used for imaging. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

Figure 2:
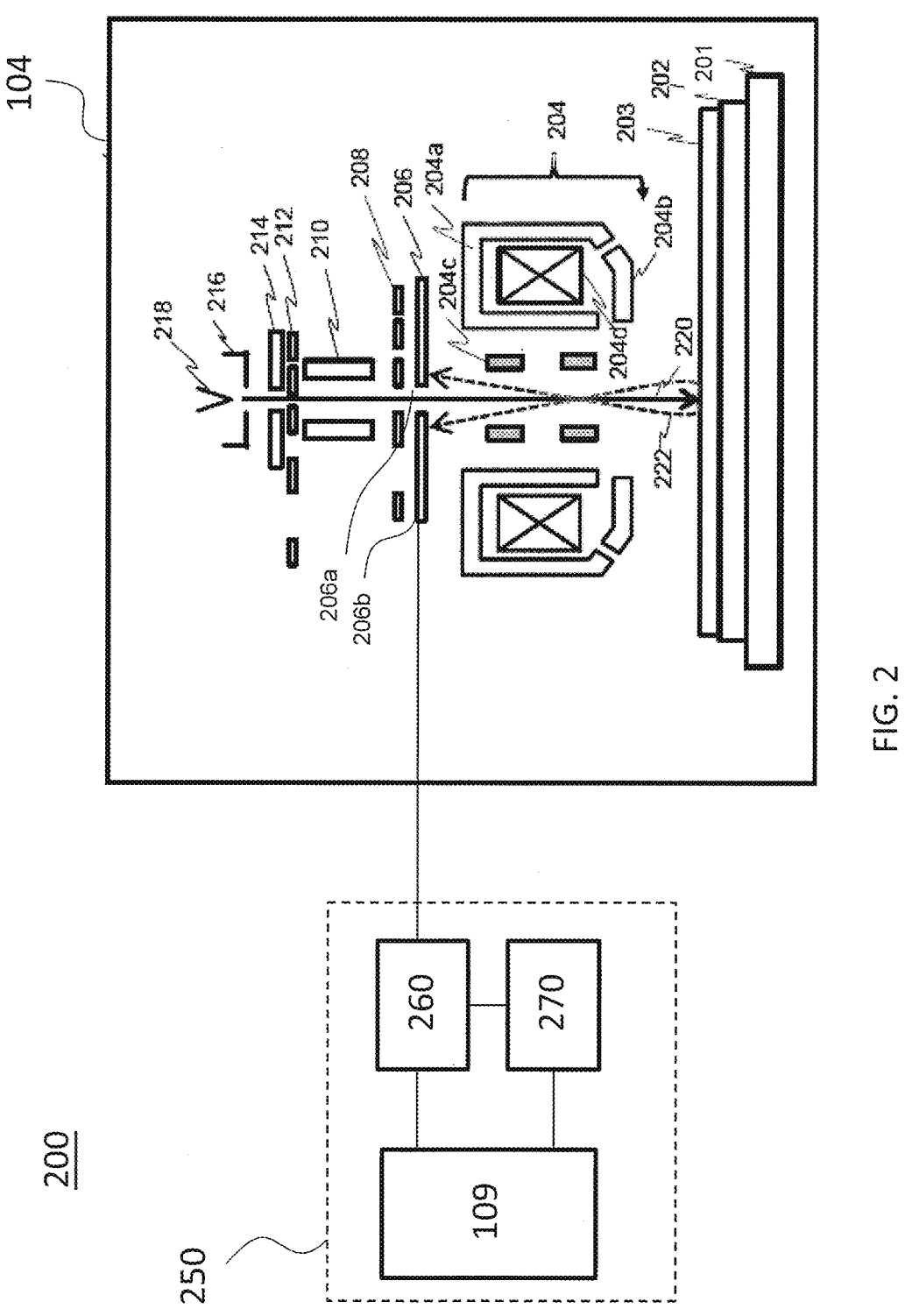
FIG. 2 is a schematic diagram illustrating an exemplary electron beam tool, consistent with embodiments of the present disclosure that may be a part of the exemplary electron beam inspection system of FIG. 1.

FIG. 2 illustrates an exemplary imaging system 200 according to embodiments of the present disclosure. Electron beam tool 104 of FIG. 2 may be configured for use in EBI system 100. Electron beam tool 104 may be a single beam apparatus or a multi-beam apparatus. As shown in FIG. 2, electron beam tool 104 includes a motorized sample stage 201, and a wafer holder 202 supported by motorized sample stage 201 to hold a wafer 203 to be inspected. Electron beam tool 104 further includes an objective lens assembly 204, an electron detector 206 (which includes electron sensor surfaces 206a and 206b), an objective aperture 208, a condenser lens 210, a beam limit aperture 212, a gun aperture 214, an anode 216, and a cathode 218. Objective lens assembly 204, in some embodiments, may include a modified swing objective retarding immersion lens (SORIL), which includes a pole piece 204a, a control electrode 204b, a deflector 204c, and an exciting coil 204d. Electron beam tool 104 may additionally include an Energy Dispersive X-ray Spectrometer (EDS) detector (not shown) to characterize the materials on wafer 203.

A primary electron beam 220 is emitted from cathode 218 by applying a voltage between anode 216 and cathode 218. Primary electron beam 220 passes through gun aperture 214 and beam limit aperture 212, both of which may determine the size of electron beam entering condenser lens 210, which resides below beam limit aperture 212. Condenser lens 210 focuses primary electron beam 220 before the beam enters objective aperture 208 to set the size of the electron beam before entering objective lens assembly 204. Deflector 204c deflects primary electron beam 220 to facilitate beam scanning on the wafer. For example, in a scanning process, deflector 204c may be controlled to deflect primary electron beam 220 sequentially onto different locations of top surface of wafer 203 at different time points, to provide data for image reconstruction for different parts of wafer 203. Moreover, deflector 204c may also be controlled to deflect primary electron beam 220 onto different sides of wafer 203 at a particular location, at different time points, to provide data for stereo image reconstruction of the wafer structure at that location. Further, in some embodiments, anode 216 and cathode 218 may be configured to generate multiple primary electron beams 220, and electron beam tool 104 may include a plurality of deflectors 204c to project the multiple primary electron beams 220 to different parts/sides of the wafer at the same time, to provide data for image reconstruction for different parts of wafer 203.

Exciting coil 204d and pole piece 204a generate a magnetic field that begins at one end of pole piece 204a and terminates at the other end of pole piece 204a. A part of wafer 203 being scanned by primary electron beam 220 may be immersed in the magnetic field and may be electrically charged, which, in turn, creates an electric field. The electric field reduces the energy of impinging primary electron beam 220 near the surface of wafer 203 before it collides with wafer 203. Control electrode 204b, being electrically isolated from pole piece 204a, controls an electric field on wafer 203 to prevent micro-arching of wafer 203 and to ensure proper beam focus.

A secondary electron beam 222 may be emitted from the part of wafer 203 upon receiving primary electron beam 220. Secondary electron beam 222 may form a beam spot on sensor surfaces 206a and 206b of electron detector 206. Electron detector 206 may generate a signal (e.g., a voltage, a current, etc.) that represents an intensity of the beam spot, and provide the signal to an image processing system 250. The intensity of secondary electron beam 222, and the resultant beam spot, may vary according to the external or internal structure of wafer 203. Moreover, as discussed above, primary electron beam 220 may be projected onto different locations of the top surface of the wafer or different sides of the wafer at a particular location, to generate secondary electron beams 222 (and the resultant beam spot) of different intensities. Therefore, by mapping the intensities of the beam spots with the locations of wafer 203, the processing system may reconstruct an image that reflects the internal or surface structures of wafer 203.

Imaging system 200 may be used for inspecting a wafer 203 on sample stage 201, and comprises an electron beam tool 104, as discussed above. Imaging system 200 may also comprise an image processing system 250 that includes an image acquirer 260, storage 270, and controller 109. Image acquirer 260 may comprise one or more processors. For example, image acquirer 260 may comprise a computer, server, mainframe host, terminals, personal computer, any kind of mobile computing devices, and the like, or a combination thereof. Image acquirer 260 may connect with a detector 206 of electron beam tool 104 through a medium such as an electrical conductor, optical fiber cable, portable storage media, IR, Bluetooth, internet, wireless network, wireless radio, or a combination thereof. Image acquirer 260 may receive a signal from detector 206 and may construct an image. Image acquirer 260 may thus acquire images of wafer 203. Image acquirer 260 may also perform various post-processing functions, such as generating contours, superimposing indicators on an acquired image, and the like. Image acquirer 260 may be configured to perform adjustments of brightness and contrast, etc. of acquired images. Storage 270 may be a storage medium such as a hard disk, cloud storage, random access memory (RAM), other types of computer readable memory, and the like. Storage 270 may be coupled with image acquirer 260 and may be used for saving scanned raw image data as original images, and post-processed images. Image acquirer 260 and storage 270 may be connected to controller 109. In some embodiments, image acquirer 260, storage 270, and controller 109 may be integrated together as one control unit.

In some embodiments, image acquirer 260 may acquire one or more images of a sample based on an imaging signal received from detector 206. An imaging signal may correspond to a scanning operation for conducting charged particle imaging. An acquired image may be a single image comprising a plurality of imaging areas. The single image may be stored in storage 270. The single image may be an original image that may be divided into a plurality of regions. Each of the regions may comprise one imaging area containing a feature of wafer 203.

Figure 3:
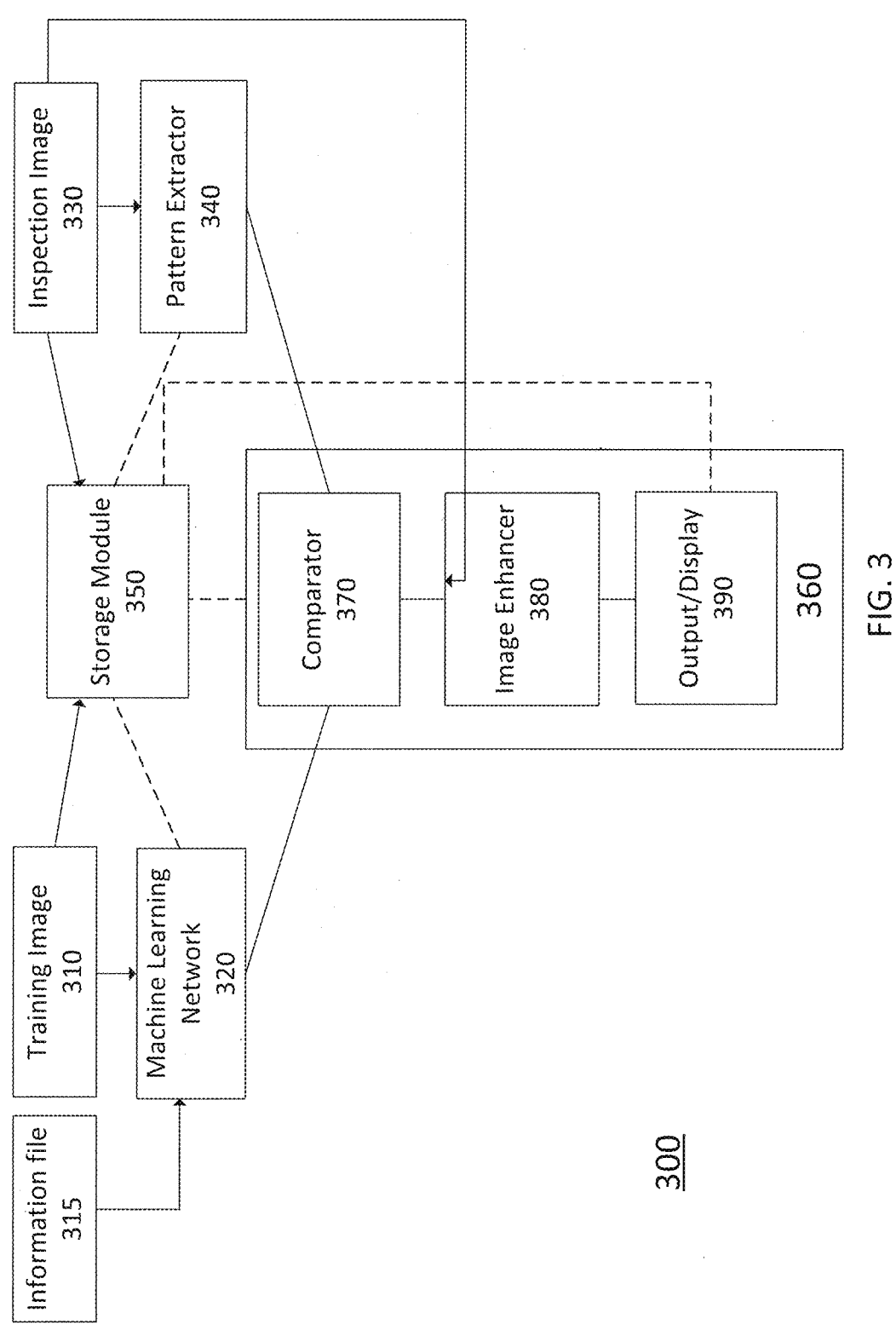
FIG. 3 is a block diagram of an exemplary image enhancement system, consistent with embodiments of the present disclosure.

Reference is now made to FIG. 3, which is a schematic diagram of an exemplary image enhancement system 300, consistent with embodiments of the present disclosure. In some embodiments, image enhancement system 300 may be part of image processing system 250 of FIG. 2. Further, image enhancement system 300 may comprise image processing system 250 including controller 109, image acquirer 260, storage 270, and the like.

Image enhancement system 300 may include a high-resolution image 310, an information file 315, a machine-learning network 320, an inspection image 330, a pattern extractor 340, a storage module 350, an image enhancement module 360, a comparator 370, an image enhancer 380, a display device 390.

High-resolution image 310 may be a high-resolution image of a portion of a sample or a wafer. As used herein, high resolution image refers to, but is not limited thereto, an image having a resolution high enough to resolve two distinct features in the image having a spacing less than 20 nm. It is to be understood that image resolution may depend on factors including, but not limited to, the amount of signal averaging utilized for image acquisition, the noise ratio of a SEM image frame, the pixel size, the SEM beam width of an on-axis beam of a multi-beam system, the SEM beam width of a single beam system, or the current supplied to the SEM beam(s) and the like. It is contemplated that one or more of the above-listed factors may be adjusted to provide the desired resolution for acquiring high-resolution image 310. For example, small spot width, small pixel size, low current, minimum beam profile aberration, high signal averaging and the like are all factors that can contribute to increasing the resolution for high-resolution image 310.

High-resolution image 310 may be acquired using image acquirer 260 of EBI system 100 or any such system capable of acquiring high resolution images. High-resolution image 310 may be acquired by any inspection system that may generate an inspection image of a wafer. The wafer may be a semiconductor wafer substrate, or a semiconductor wafer substrate having one or more epi-layers or process films, for example. The embodiments of the present disclosure do not limit the specific type of an inspection system as long as the system may generate a wafer image having a sufficient resolution.

In some embodiments, high-resolution image 310 may be acquired in an offline mode and utilized as a training image. As used herein, offline mode refers to an operation mode of image acquirer 260 or EBI system 100 when the system is not being utilized for wafer processing in a production run. For example, offline mode may comprise operation of image acquirer 260 or EBI system 100 before the actual inspection begins or before an actual processing run. In some embodiments, high-resolution image 310 is acquired by an image acquirer located apart from the process equipment, for example, including a stand-alone EBI system or an image acquirer. Acquiring high-resolution image 310 in offline mode may help significantly increase throughput of SEM inspection tools since image enhancement may be performed by comparing the acquired high throughput inspection image 330 to an already existing high-resolution image 310.

Alternatively, in some embodiments, high-resolution image 310 may be acquired during the inspection process along with the acquisition of high throughput inspection image(s) 330. For example, if image acquirer 260 or EBI system 100 implements a multi-beam system, image acquirer 260 or EBI system 100 may be configured to utilize an on-axis beam of the multi-beam system to acquire high-resolution image 310 and utilize off-axis beam(s) to acquire high throughput inspection image(s) 330. Image acquirer 260 or EBI system 100 may also be configured to supply different levels of current to a single-beam system in an effort to acquire high-resolution image 310 (acquired using a low-current beam, or when a lower current is supplied to the beam system) and high throughput inspection image(s) 330 (acquired using a high-current beam, or when a higher current is supplied to the beam system). It is to be understood, therefore, that high-resolution image 310 may be acquired before, after, or performed simultaneously with the acquisition of high throughput inspection image(s) 330.

It is also to be understood that image acquirer 260 or EBI system 100 may be configured to acquire more than one high-resolution image 310. Such high-resolution images 310 may include, for example, a reference image of a location on wafer 203, or a reference image of a feature on wafer 203, or a post-processing reference image, or the like. In some embodiments, high-resolution image(s) 310 may be one or more reference images of locations or features from wafers of multiple product types. For example, when multiple product types are fabricated in the same fab line using the same processes, a reference image of a particular feature from a first product type may be used as a high-resolution image for the particular feature from a second product type having a different build compared to the first product type.

In some embodiments, high-resolution image 310 may be a review-mode image, which is an image acquired under optimal acquisition conditions. The review-mode image may have a higher resolution, for example, optimum magnification, optimum contrast and brightness, optimum e-beam intensity, etc. Detector 206 settings may also be optimized to acquire high resolution images.

In some embodiments, image enhancement system 300 may include an information file 315 that contains reference feature information. Information file 315 may comprise a wafer design layout in Graphic Database System (GDS) format, Graphic Database System II (GDS II) format including a graphical representation of the features on the wafer surface, or an Open Artwork System Interchange Standard (OASIS) format, or a Caltech Intermediate Format (CIF), among others. The wafer design layout may be based on a pattern layout for constructing the wafer. The wafer design layout may correspond to one or more photolithography masks or reticles used to transfer features from the photolithography masks or reticles to wafer 203, for example. GDS information file or OASIS information file, among others, may comprise feature information stored in a binary file format representing planar geometric shapes, text, and other information related to wafer design layout. OASIS format may help significantly reduce data volume, resulting in a more efficient data transfer process. A large amount of GDS or OASIS format images may have been collected and may make up a large dataset of comparison features.

In some embodiments, image enhancement system 300 may also include a machine learning network 320. Machine learning network 320 may be configured to extract feature information from high-resolution image 310. Machine learning network 320 may also extract relevant features from information file 315 comprising GDS format files or OASIS format files. Machine learning network 320 may include, for example, an artificial intelligence system, a neural network, or a deep-learning technique, a software implemented algorithm, or the like. The feature extraction architecture of machine learning network 320 may comprise a convolutional neural network, for example. In some embodiments, a linear classifier network of deep learning architecture may be adopted as a starting point to train and build feature extraction architecture of machine learning network 320.

In some embodiments, a machine learning model may include multiple layers. For example, the architecture of a convolutional neural network may comprise input, first convolution, first pooling, second convolution, second pooling, one or more hidden layers, activation, and output layers. Based on the nature and complexity of the features, each layer of the architecture may have different numbers of sub samples generated. After the first convolution operation, there may be less than 10 sub samples generated in a first pool. While after the second convolution operation, the second layer may have more than 10 sub samples generated in a second pool. In some embodiments, variation between layers may be introduced by the complexity of geometric features in the layout. Features having more geometric information may have a higher probability to generate more sub samples. For example, a complex feature may exhibit various sub-shapes that may be broken up and analyzed as individual attributes.

In some embodiments, machine learning network 320 may receive high-resolution images 310 or information file 315 to extract relevant features and knowledge. Machine learning network 320 may include a temporary storage medium (not shown in figures) to store received information files or high-resolution images. The temporary storage medium may also be configured to store post-processing data (e.g., such as extracted relevant features). In some embodiments, the feature extraction algorithm or the deep learning algorithm, or the neural network may be configured to include a step to retrieve a high-resolution image or an information file from either the temporary storage medium or storage module 350 (discussed later).

Machine learning network 320 may also receive additional training images as input. Such training images may include, for example, a wafer design plan based on GDS or OASIS designs, or review mode image having high resolution, additional SEM images acquired at a high resolution, and the like. Such training images, together with high-resolution images 310, may be jointly referred to as training data and may be stored in a user-defined storage, a database, or storage module 350, which is accessible by the user. The training data may be fed into machine-learning network 320 designed to extract trained features and knowledge from the training data. The extracted feature information and knowledge may be stored in storage module 350, which may be configured to be accessible to other components of image enhancement system 300. In some embodiments, the extraction of trained features using machine-learning network 320 may be performed offline, such that these steps do not adversely impact the overall inspection throughput.

In some embodiments, machine learning network 320 is a self-supervised network configured to extract one or more trained features from the training data. Machine learning network 320 may be configured to train itself to extract one or more trained features from high-resolution images 310, additional training images, as well as from information file 315 based on previously identified trained features. In some embodiments, machine learning network 320 may extract trained features from high-resolution images 310, additional training images, as well as from information file 315 in offline mode.

In some embodiments, image enhancement system 300 may acquire inspection image 330 as a low-resolution image of a sample, a feature of wafer 203, a region of interest on wafer 203, or the entire wafer 203. Inspection image 330 may be acquired using image acquirer 260 of EBI system 100 or any such inspection system capable of acquiring low resolution images. Inspection image 330 may be acquired by any inspection system that may generate an inspection image of a wafer or a region of interest on the wafer. Wafer 203 may be a semiconductor wafer substrate, or a semiconductor wafer substrate having one or more epi-layers or process films, for example. The embodiments of the present disclosure do not limit the specific type of an inspection system as long as the system may generate a wafer image. In some embodiments, inspection image 330 may be an optical image acquired using an optical microscope, for example.

In some embodiments, inspection image 330 is a high-throughput mode image acquired in-line during wafer processing. Inspection image 330 acquired as such may be a degraded, distorted, inferior, or a misrepresentative image of the feature of a wafer.

In some embodiments, image enhancement system 300 may include a pattern extractor 340. Pattern extractor 340 may be configured to extract global structural information or patterns from inspection image 330 in real time such as in-line during wafer processing. In some embodiments, pattern extractor 340 may be a mathematical algorithm, a software-implemented algorithm, image processing algorithm, or the like. Pattern extractor 340 may be integrated into image acquirer 260 or may be configured to operate as a separate, stand-alone unit configured to process inspection image 330. In some embodiments, pattern extractor 340 may comprise an image processing unit (not shown) configured to adjust brightness, contrast, saturation, flatness, noise filtering, etc. of inspection image 330 prior to storage. In some embodiments, pattern extractor 340 may extract pattern information from an already stored inspection image 330.

In some embodiments, pattern extractor 340 may include a feature extraction algorithm to extract relevant pattern information from inspection image 330. The extracted relevant pattern information may include global information, for example, global structural features, global patterns, reference fiducials, etc. The extracted relevant pattern information may be stored in a storage module, configured to be accessed by other components of image enhancement system 300.

Pattern extractor 340 may also be configured to extract global structural information, feature information, etc. from inspection image 330.

In some embodiments, image enhancement system 300 may include a storage module 350. Storage module 350 may be configured to store one or more high-resolution images 310, training images, information file 315, inspection images 330, extracted relevant features from machine learning network 320, extracted pattern information from pattern extractor 340, and the like. Storage module 350 may also be configured to share stored information with the components of image enhancement system 300, including machine learning network 320 and pattern extractor 340, for example. It is appreciated that storage module 350 may be part of storage 270 of FIG. 2.

In some embodiments, storage module 350 may be an integrated storage medium of image enhancement system 300, configured to connect with each of the components thereof. Storage module 350 may be a remote storage module accessible through wireless communications over the Internet, a cloud platform, or suitable Wi-fi communication pathways, for example.

Storage module 350 may comprise the patterns and features/knowledge library. The disclosed method can search the pattern library for matching patterns based on a degree of correspondence. For example, patterns may be determined to match if a feature design outline has a degree of similarity of 90% or more with another pattern in the pattern library. The patterns in the pattern library may comprise prior extracted patterns, standard patterns (such as patterns of standard IC features), and the like.

Image enhancement system 300 may include an image enhancement module 360 that includes one or more processors and a storage (e.g., such as storage module 350). Image enhancement module 360 may comprise comparator 370, image enhancer 380, and display device 390. It is appreciated that an image enhancement module 360 may also comprise one or more of pattern extractor 340, comparator 370, image enhancer 380, and display device 390, or combinations thereof.

Display device 390 may be configured to display the enhanced image from image enhancer 380, or inspection image 330, or high-resolution image 310, and the like. In some embodiments, display device 390 may display pre-processed and post-processed images of wafer, regions of interest, features on the wafer, etc. including for example, enhanced inspection images. Image enhancement module 360, as a single integrated unit may be connected to storage module 350, the connection configured to allow sharing of data between image enhancement module 360 and storage module 350. In some embodiments, comparator 370, image enhancer 380, and display device 390 may be individually connected to storage module 350. Other connection combinations are possible as well.

In some embodiments, comparator 370 is configured to compare extracted relevant information from machine learning network 320 and extracted pattern information from pattern extractor 340. In some embodiments, comparator 370 is configured to identify trained features from extracted trained features of high-resolution image 310 based on pattern information of inspection image 330 from pattern extractor 340, and to compare identified extracted trained features with extracted pattern information.

Comparator 370 may comprise an image processing algorithm, a software implemented algorithm, or the like. In some embodiments, comparator 370 may be configured to communicate with storage module 350. Comparator 370 may generate an output file including matching results between the identified extracted trained features and extracted pattern information. The output file generated may be stored in storage module 350. Comparator 370 may also be configured to access high-resolution image 310, training images, information file 315, extracted trained features, etc. from storage module 350 for matching purposes.

In some embodiments, comparator 370 may include a processing unit, a memory, a display, and communication pathways to interact with other components of image enhancement system 300, for example, machine learning network 320 and pattern extractor 340.

In some embodiments, image enhancer 380 may be configured to generate an enhanced image of inspection image 330 based on the one or more matching results from comparator 370. In some embodiments, image enhancer 380 receives the output file generated by comparator 370 and inspection image 330. Alternatively, comparator 370 may be integrated with image enhancer 380 as a single unit configured to compare, identify, and generate an enhanced image based on the matching results generated by comparator 370.

In some embodiments, image enhancer 380 may be configured to analyze data representing high-resolution image 310 to obtain one or more spatial-spectral characteristics (e.g., including phase and amplitude characteristics). Image enhancer 380 may apply the spatial-spectral characteristics to data representing high-throughput (or low-resolution) inspection images 330 to numerically enhance these inspection images 330.

In some embodiments, image enhancer 380 may be configured to analyze data representing high-resolution image 310 to recognize a feature in high-resolution image 310 (e.g., an edge). Image enhancer 380 may numerically blur the data representing high-resolution image 310 to simulate data representing a blurred image acquired at a lower resolution. Image enhancer 380 may determine whether a portion of the data representing the blurred image fits a portion of data representing a low-resolution inspection image 330. If image enhancer 380 determines that there is a fit, image enhancer 380 may recognize the portion of the data representing low-resolution inspection image 330 as a position containing the recognized feature (e.g., the edge).

In some embodiments, image enhancer 380 may be configured to focus the enhancement on a few features, such as edges and the like. In such embodiments, rather than attempting to enhance the image quality of the entire low-resolution inspection image 330, image enhancer 380 may be configured to only enhance the image quality of certain areas of interest, which may further improve its accuracy and throughput.

In some embodiments, image enhancer 380 is an executable application or software. Image enhancer 380 may comprise a software-implemented algorithm, an image processing algorithm, or a mathematical algorithm, or the like.

Image enhancement module 360 may include an output device or display device 390 configured to display the generated enhanced inspection image. Display device 390 may be integrally connected with EBI system 100. In some embodiments, display device 390 may be a handheld display device, a wearable display device, a multi-screen display, an interactive display device, or the like. Other suitable display devices may be used as well.

The enhanced inspection image may be displayed on display device 390 of image enhancement system 300. Display device 390 may be integrated within electron beam tool 104 or may be a separate output device located in a remote location.

In some embodiments, display device 390 may be remotely located and operated through a wireless communication network, for example, Wi-fi, internet, or a cloud network. Other suitable wireless communication networks and platforms may be used as well. Display device 390 may also be connected with storage module 350 to store displayed images of a sample or a region of interest on the wafer. Display device 390 may also be used to display real-time pre-processing, inspection image 330.

FIG. 4 illustrates an exemplary image enhancement system 300 consistent with embodiments of the present disclosure. In some embodiments, image enhancement system 300 may be part of image processing system 250 of FIG. 2. Further, image enhancement system 300 may comprise image processing system 250 including controller 109, image acquirer 260, storage 270, and the like.

Image enhancement system 300 may store high-resolution image 310. As illustrated, high-resolution image 310 is a high-resolution image from which relevant trained features may be extracted. Image enhancement system 300 can use high-resolution image 310 to train machine learning network 320 before performing high-throughput inspection. High-resolution image 310 may include a high-resolution optical microscope image, a high-resolution secondary electron microscope image, a back-scattered electron beam image, an atomic force microscope image, or the like.

As illustrated, high-resolution image 310 of FIG. 4 may include trained features 430. Trained features 430 may include, for example, one or more circular structures arranged in a band-like arrangement, one or more bands of substrate material, metal interconnect lines, spacing between metal interconnect lines, contact pads, edges, etc. defined by the features on the mask and transferred on the wafer or a substrate by a photolithography process. Trained features 430 may comprise one or more shapes, dimensions, arrangement, material, orientation, etc. of the structures.

Information file 315 may comprise a layout of an intended wafer design or chip design to be transferred on to wafer 203. Information file 315 may include information stored in a suitable format, for example, GDS, GDSII, OASIS, or CIF.

Information file 315 may comprise knowledge, which may include information associated with trained features 430, for example, relative orientation of structures in a feature, physical location information of features on the wafer, x-y location coordinates of features on a wafer, critical dimensions and critical dimension tolerances, and the like. In some embodiments, knowledge may include target GDS information, target GDSII information, target OASIS information, or the like.

In some embodiments, information file 315 may contain critical dimensions information. Critical dimension tolerances for optical photolithography may be extremely difficult to achieve and may require a reiterative correction process including adjustments to features on the mask. Some possible solutions include, but are not limited to, resolution enhancement techniques such as Optical Proximity Correction, Phase Shift Masks, and Off-Axis Illumination.

Optical Proximity Correction involves changing the actual chrome width on the mask to be different from the desired photoresist width on the wafer. For example, the difference between the size of an isolated line and a line in a dense array of equal lines and spaces is the most commonly observed proximity effect in optical lithography. The magnitude of this print bias is affected by the optical parameters of the stepper and the contrast of the photoresist. If the optical parameters of the stepper and the contrast of the photoresist remain constant, the print bias may be characterized and corrected by biasing the mask. This type of geometry-dependent mask biasing is commonly used to maintain critical dimensions and critical dimension tolerances on an actual wafer. The mask bias is defined as the actual chrome width minus the nominal (unbiased) chrome width. Thus, a positive bias means the chrome has been made bigger. Phase Shift Masks and Off-Axis Illumination techniques may also be employed to adjust mask bias such that the features transferred on to wafer 203 by photolithography process match the desired feature shape and size.

Information file 315 may include target bias-corrected mask information, uncorrected mask information, bias-corrected feature information of a reticle for the steppers, uncorrected feature information of a reticle, or combinations thereof.

In some embodiments, machine learning network 320 is configured to extract trained features 430 from high-resolution image 310 or knowledge from information file 315. In some embodiments, training machine learning network 320 is automated. For example, an automated machine learning network may receive high-resolution image 310 or information from information file 315, unprompted. After receiving high-resolution image 310 or information from information file 315, automated machine learning network may extract relevant trained features, unprompted.

The extracted trained features 430 may be stored in storage module 350 or temporarily stored in a repository (not shown). The repository may be accessed by comparator 370, machine learning network 320, image enhancer 380, display device 390, or the like.

In some embodiments, inspection image 330 is a low resolution, high throughput mode image, acquired by EBI system 100 in real-time during an inspection step in the fabrication process. As illustrated in FIG. 4, inspection image 330 comprises a degraded, out-of-focus image showing features and patterns, though not clearly resolved, for example, features and patterns similar to those depicted in high-resolution image 310. Inspection image 330 also shows a defect towards the center of the image. The defect may comprise a void, a particle, unstripped photoresist, over-etched surface of a feature, etc.

Inspection image 330 may be an optical image from an optical microscope. In some embodiments, one or more views of inspection image 330 may be acquired at a given inspection step in the process. Pattern extractor (e.g., pattern extractor 340 of FIG. 3) may be configured to process one or more views of inspection image 330 to determine the "optimum" image to extract relevant pattern information 410 from.

Image enhancement module 360 may be configured to process inspection image 330 to generate enhanced image 420. Image enhancement module 360 may include comparator 370, image enhancer 380, and display device 390 of FIG. 3. In some embodiments, image enhancement module 360 may also include pattern extractor 340. Comparator 370 may be configured to identify the extracted trained features 430 or knowledge from information file 315, based on pattern information 410 extracted by pattern extractor 340. After identifying the trained features, comparator 370 may compare extracted trained features 430 with pattern information 410 and generate an output. The output may comprise information associated with comparison results and extracted trained features 430, which are then used to enhance the inspection image. For example, as shown in enhanced image 420 of FIG. 4, the features of the circular structures, the bands, and the defect have been enhanced using the information derived from high-resolution image 310. The output may be temporarily stored in storage module 350. Image enhancer 380 may be configured to receive the output from comparator 370 or from storage module 350 and inspection image 330, to generate an enhanced image 420.

In some embodiments, image enhancer 380 may perform the comparison of identified extracted trained features 430 with extracted pattern information 410. In some embodiments, comparator 370 may be integrated with image enhancer 380, operating as a single unit.

Enhanced image 420 may be displayed on display device 390. In some embodiments, enhanced image 420 is displayed on display device 390 and stored in storage module 350. Enhanced image 420 may include features and patterns that are enhanced compared to the features and patterns of inspection image 330, for example, the features and patterns are more clearly resolved. In some embodiments, the brightness and contrast may be optimized compared to inspection image 330. The defect in inspection image 330 may be better resolved and focused, which may help the reviewer accurately identify defects and process related issues.

Enhanced image 420 may be used for inspection, defect identification and analysis, process verification, quality control, yield improvement analysis, etc. in real-time while maintaining the high throughput required during the inspection steps in a wafer fabrication process. Enhanced image 420 may be displayed on multiple displays simultaneously. For example, enhanced image 420 representing an inspection image of a wafer after the photoresist strip step but prior to the following metal deposition step, may be reviewed by multiple reviewers or users requesting the information. In some embodiments, enhanced image 420 may be retrieved by a user prompt at a later time for review and in-depth analysis. Enhanced image 420 may be stored in a suitable format, for example, a Joint Photographic Experts Group (JPEG) file, a Portable Network Graphic (PNG) file, a Portable Document Format (PDF) file, a Tagged Image File Format (TIFF) file, etc.

Figure 5:
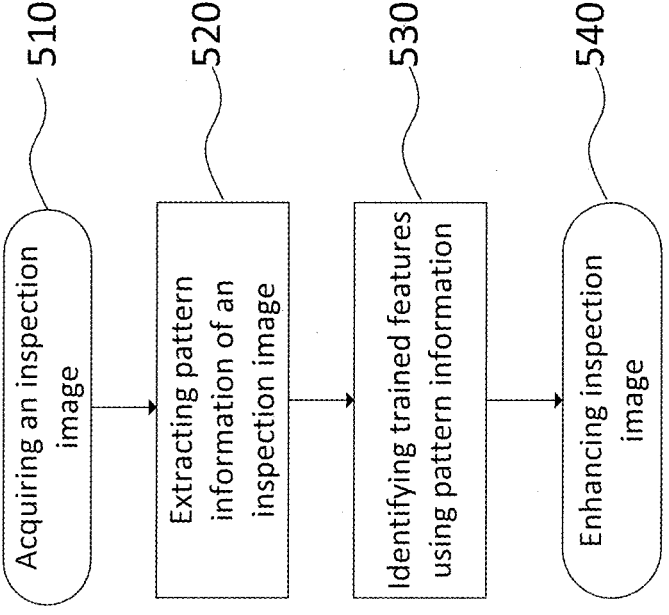
FIG. 5 is a flow chart illustrating an exemplary image enhancement method, consistent with embodiments of the present disclosure.

FIG. 5 is a flow chart illustrating an exemplary image enhancement method consistent with embodiments of the present disclosure. The image enhancement method may be performed by an image enhancement module that may be coupled with a charged particle beam apparatus, including EBI system 100. For example, a controller (e.g., controller 109 of FIG. 2) may include the image enhancement module and may be programmed to implement the image enhancement method. It is appreciated that the charged particle beam apparatus may be controlled to image a wafer or a region of interest on the wafer. Imaging may comprise scanning the wafer to image at least a portion of the wafer.

In step 510, one or more scanned raw images of the inspection area may be obtained. The one or more scanned raw images may comprise the entire surface of the wafer, or just a portion of the surface of the wafer. Image acquisition in step 510 may comprise receiving signals from a detector of the charged particle beam apparatus, such as an electron detector (for example, electron detector 206 of FIG. 2), or loading an image from storage (e.g., storage 270 of FIG. 2).

In step 520, pattern information (e.g., pattern information 410) on the wafer is identified and extracted by a pattern extractor. The pattern information may comprise global structural information, for example, reference fiducials for a photolithography process on the wafer, reference features on a wafer, etc. Step 520 may include relevant feature extraction. Identification of relevant features and patterns may be performed by a feature extraction algorithm. For example, the feature extraction of step 520 may include performing image analysis on an acquired image of the wafer surface using a first set of parameters or using a first image processing algorithm. Identification of relevant features may include determining a location, a group of locations, or a range of locations in x-y coordinates on the wafer surface. The location information may be stored in a wafer map database (provided in, for example, storage module 350 of FIG. 3).

In step 530, trained features from a training image (e.g., high-resolution image 310 of FIG. 3) may be identified, corresponding to the extracted pattern information. The trained features may be extracted from a wafer design plan based on an information file (e.g., information file 315) or a training image (e.g., high-resolution image 310 of FIG. 3). The training image may be a high-resolution image acquired in the offline mode or review mode by an image acquisition system. The wafer design plan may be registered in advance. For example, the wafer design plan may be a graphical representation of the features on the wafer surface. The wafer design plan may be based on a pattern layout for designing the wafer. The wafer design plan may correspond to a mask used to fabricate the wafer. The wafer design plan may be stored in a wafer design database (provided in, for example, storage module 350 of FIG. 3). According to the information data from the information file or the training image, individual features may be extracted corresponding to the identified global structural information or pattern information. For example, based on the x-y coordinates of the pattern locations identified in step 520, relevant trained features comprising geometry information of original feature designs may be gathered.

In some embodiments, identifying relevant trained features based on extracted pattern information from the inspection image in step 520 may be performed by a machine learning network (e.g., machine learning network 320 of FIG. 3). The machine learning network may be automated to retrieve trained feature information from information file or trained feature information from training image. Machine learning network may also be automated to extract relevant trained features from the information file or the training image. The extracted trained feature/knowledge may be stored in storage or a repository configured to store information. The extracted trained feature/knowledge may be stored temporarily or for long-term purposes. The extracted trained feature/knowledge may be accessed by an image enhancement module (e.g., image enhancement module 360 of FIG. 3) or an image enhancer (e.g., image enhancer 380 of FIG. 3).

The disclosed method may search a pattern library (stored in, for example, storage module 350) for matching patterns based on a degree of correspondence. For example, patterns may be determined to match if a feature design outline has a degree of similarity of 90% or more with another pattern in the pattern library. The patterns in the pattern library may comprise prior extracted patterns, standard patterns (such as patterns of standard IC features), and the like.

In step 540, the inspection image is enhanced based on the comparison results between the identified trained relevant features/knowledge from the training image and the extracted pattern information from the inspection image. In step 540, the image enhancement comprises generating an enhanced image (e.g., enhanced image 420 of FIG. 4) based on the matched results from the comparison of the extracted trained features/knowledge and the extracted pattern information, and the extracted trained features/knowledge itself. The matched results and the trained features 430 are then used to enhance the inspection image.

Figure 6:
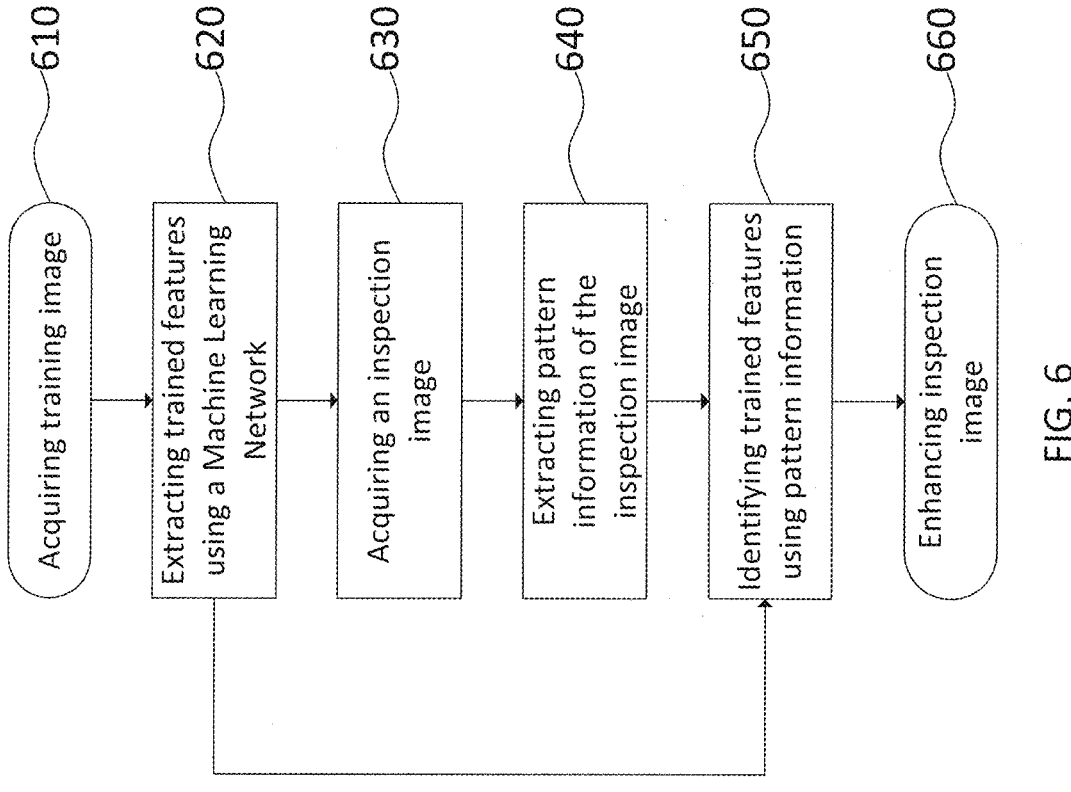
FIG. 6 is a flow chart illustrating an exemplary image enhancement method using a machine learning network, consistent with embodiments of the present disclosure.

FIG. 6 is a flow chart illustrating an exemplary image enhancement method consistent with embodiments of the present disclosure. The image enhancement method may be performed by an image enhancement module that may be coupled with a charged particle beam apparatus (e.g., EBI system 100). For example, a controller (e.g., controller 109 of FIG. 2) may include the image enhancement module and may be programmed to implement the image enhancement method. It is appreciated that the charged particle beam apparatus may be controlled to image a wafer or a region of interest on the wafer. Imaging may comprise scanning the wafer to image a portion of the wafer, which may include scanning the wafer to image the entire wafer. In some embodiments, the image enhancement method may be performed by an image enhancer module (e.g., image enhancer 380 of FIG. 3) or image enhancement system 300.

In step 610, a training image (e.g., high-resolution image 310 of FIG. 4) is acquired. The training image may be a high-resolution image, a review mode image, a superior quality image acquired under optimum acquisition conditions, or the like. The training image may be acquired offline, for example, using a different charged particle beam apparatus, an optical microscope, an atomic force microscope, etc. Training image acquisition may be performed at a remote location different than the wafer fabrication location and stored in storage module (e.g., storage module 350 of FIG. 3) or a different storage unit accessible through a communication network. The acquisition of training image may be performed offline to minimize the impact of image enhancement process on inspection throughput.

In step 620, relevant trained features are extracted from the acquired training image using machine learning network (e.g., machine learning network 320 of FIG. 3). Relevant features may also be extracted from information file (e.g., information file 315 of FIG. 3) comprising feature information, for example, wafer design plan, or a mask layout, graphical layout of one or more layers of the integrated circuit. Information file may comprise information stored in GDS format, GDSII format, OASIS format, or the like.

The machine learning network may be configured to extract relevant trained features automatically. Machine learning network may be automated to retrieve trained feature information from the information file or trained feature information from the training image. Extracting relevant trained features using machine learning network may be performed offline using a different processor at a different location. The machine learning network may be integrated into EBI system 100 or may be operated as a stand-alone unit operated remotely.

In step 630, an inspection image (e.g., inspection image 330 of FIG. 3) of the wafer is acquired after the wafer is loaded. For example, the wafer may be placed on a sample stage and prepared for imaging. The inspection image may be a scanned raw image having a low resolution. Inspection image 330 may be a high throughput inspection mode image acquired with a non-optimum set of acquisition conditions. Inspection image may be a degraded or inferior quality image, or low-resolution image, or the like. Inspection image is acquired in-line during the wafer fabrication process. Step 630 and step 610 may be performed separately using one or more image acquirers (e.g., image acquirer 260 of FIG. 2) or EBIs (e.g., EBI system 100 of FIG. 1). Inspection image and training image may be acquired by the same EBI at different times.

In step 640, extraction of global structural information or pattern information (e.g., pattern information 410 of FIG. 4) from the inspection image is performed. Step 640 may include performing image analysis on the acquired image of the wafer surface using a first set of parameters or using a first image processing algorithm. In step 640, pattern information of the wafer is identified and extracted by a pattern extractor (e.g., pattern extractor 340 of FIG. 3). The pattern information may comprise global structural information, for example, reference fiducials for a photolithography process on the wafer, reference features on a wafer, etc. Step 640 may also include extraction of relevant feature(s) using a feature extraction algorithm. Identification and extraction of relevant pattern information may include determining a location, a group of locations, or a range of locations in x-y coordinates on the wafer surface. The location information may be stored in a wafer map database stored in the storage module.

In step 650, trained features from the training image may be identified based on the identified pattern information, using the image enhancement module or a comparator (e.g., comparator 370 of FIG. 3). The trained features may also be extracted from a wafer design plan based on the information file or the training image. The training image may be a high-resolution image acquired in an offline mode or a review mode by an image acquisition system, for example, EBI system 100. The wafer design plan may be registered in advance. For example, the wafer design plan may be a graphical representation of the features on the wafer surface. The wafer design plan may be based on a pattern layout for designing the wafer. The wafer design plan may correspond to a mask used to fabricate the wafer. The wafer design plan may be stored in a wafer design database.

The mask may comprise elementary 2-dimensional shapes including, but not limited to, rectangles, which may have sharp corners. To describe the error in the actual resist image from a target or desired resist image, a target image is defined. When printed in photoresist, the corners from the original design may be rounded to some extent. A certain amount of corner rounding may be acceptable. Although, there is no reason to round the corners of the designed mask layout, there is also no reason to insist that the final printed pattern match the square corners of the design. Thus, the actual desired pattern may deviate from the designed pattern due to an acceptable amount of corner rounding. Alternatively, mask-biasing may be used to modify the chrome features such that the eventual printed features on the wafer are the desired shape and size. The target GDS information (e.g., information contained in information file 315 of FIG. 3) may comprise mask biasing data.

Wafer design plan stored in information file may comprise target GDS or target GDSII information. As referred to herein, target GDS information may include updated or adjusted mask feature information based on wafer processing conditions. For example, transferring nano-sized features from a mask to a wafer may include mask biasing to accommodate optical proximity correction, as discussed above. Mask biasing for optical proximity correction may comprise changing the actual chrome width on the mask to be different from the desired photoresist width on the wafer. For example, the difference between the size of an isolated line and a line in a dense array of equal lines and spaces is the most commonly observed proximity effect in optical lithography. The magnitude of this print bias may be strongly affected by the optical parameters of the stepper or the contrast of the photoresist. If the optical parameters of the stepper or the contrast of the photoresist remain constant, the print bias may be characterized and corrected by biasing the mask. This type of geometry-dependent mask biasing is commonly used to maintain critical dimensions and critical dimension tolerances on an actual wafer. The mask bias is defined as the actual chrome width minus the nominal (unbiased) chrome width. Thus, a positive bias means the chrome has been made bigger.

In step 650, identifying relevant trained features based on extracted pattern information from inspection image in step 640, may be performed by machine learning network. Machine learning network may be automated to retrieve trained feature information from information file or trained feature information from the training image. Machine learning network may also be automated to extract relevant trained features from information file or the training image. Extracted trained features (e.g., trained features 430 of FIG. 4) may be stored in storage module or a repository configured to store information. Extracted trained features may be stored temporarily or for long-term purposes. Extracted trained features may be accessed by the image enhancement module or the image enhancer.

In step 660, inspection image is enhanced based on the comparison results between the identified trained relevant features from the training image and extracted pattern information from inspection image. In step 660, image enhancement comprises generating an enhanced image (e.g., enhanced image 420 of FIG. 4) or enhancing the inspection image based on the matched results from the comparison of extracted trained features and extracted pattern information, and the extracted trained features itself. The matched results and the trained features are then used to enhance the inspection image. The matched results and the trained features may be stored in the storage module.

Enhanced images may be used for inspection, defect identification and analysis, process verification, quality control, yield improvement analysis, etc. in real-time while maintaining the high throughput required during the inspection steps in a wafer fabrication process. Enhanced images may be displayed on multiple displays simultaneously. For example, enhanced images representing inspection images of a wafer after the photoresist strip step but prior to the following metal deposition step may be reviewed by multiple reviewers or multiple users requesting the information. In some embodiments, enhanced images may be retrieved by a user prompt at a later time for review and in-depth analysis. Enhanced images may be stored in a suitable format, for example, a JPEG file, a PNG file, a PDF file, a TIFF file, etc.

Referring generally back to FIG. 3. In some embodiments, image enhancement system 300 may analyze high-resolution image 310 to develop deconvolution or benchmarking strategies to enhance image quality of low-resolution inspection image(s) 330. In some embodiments, image enhancement system 300 may analyze high-resolution image 310 to develop deconvolution or benchmarking strategies in an offline mode. Alternatively, or additionally, image enhancement system 300 may analyze high-resolution image 310 to develop deconvolution or benchmarking strategies during high-throughput inspection. It is contemplated that image enhancement system 300 may utilize such deconvolution or benchmarking strategies to enhance image quality of low-resolution inspection image(s) 330 in addition to performing the image pattern-based enhancement process described above. Alternatively, image enhancement system 300 may utilize such deconvolution or benchmarking strategies to enhance image quality of low-resolution inspection image(s) 330 instead of performing the image pattern-based enhancement process described above. In some embodiments, image enhancement system 300 may allow the user to specify (e.g., via a user interface) which enhancement process or processes to perform.

Figure 7:
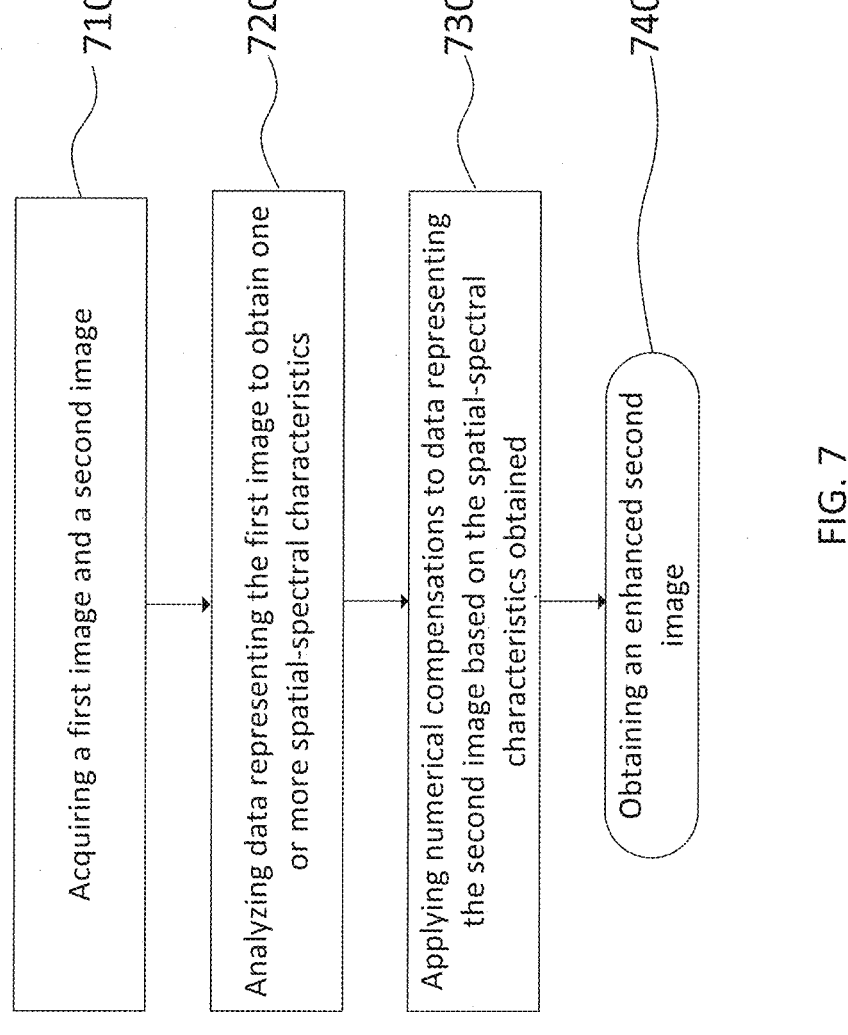
FIG. 7 is a flow chart illustrating an exemplary image enhancement method, consistent with embodiments of the present disclosure.

FIG. 7 is a flow chart illustrating an exemplary image enhancement method that can be performed by an image enhancement system (e.g., image enhancement system 300 of FIG. 3) to analyze a high-resolution image (e.g., high resolution image 310 of FIG. 4), develop deconvolution or benchmarking strategies, and enhance image quality of a low-resolution inspection image(s) (e.g., low-resolution image 330 of FIG. 4).

In step 710, one or more scanned images of an inspection area may be acquired. At least one of the images may include the high-resolution image and at least one of the images may include the low-resolution inspection image. For illustrative purposes, the high-resolution image may be referred to as a first image (or first SEM image) and the low-resolution inspection image may be referred to as a second image (or second SEM image). It is to be understood that the terms "first" and "second" do not suggest that the first image needs to be acquire before the second image. It is contemplated that the first image and the second image may be acquired simultaneously (e.g., the first image may be acquired using an on-axis beam of a multi-beam system and the second image may be acquired using an off-axis beam of that multi-beam system) or sequentially (e.g., the first image may be acquired before the second image, or vice versa).

In step 720, data representing the high-resolution image may be analyzed to obtain one or more spatial-spectral characteristics contained therein. Relevant spatial-spectral characteristics may include phase and amplitude characteristics. In step 730, the spatial-spectral characteristics obtained may be utilized to numerically compensate data representing the low-resolution image, producing an enhanced image in step 740. It is noted that because wafer inspections are typically carried out by scanning repeating features with only small variations, performing such numerical compensations can effectively and efficiently enhance the image qualities of low-resolution inspection images.

FIG. 8 is an illustration depicting such a numerical compensation process. Specifically, a SEM signal representing a first image (or a portion of the first image) acquired at a high resolution is depicted as high-resolution data 810. A SEM signal representing a second image (or a portion of the second image) acquired at a low resolution is depicted as low-resolution data 820. It is noted that both high-resolution data 810 and low-resolution data 820 contain noises, which may complicate straight-forward deconvolution processes (e.g., Wiener deconvolution process and the like) and render these deconvolution processes ineffective. Furthermore, it is noted that deconvolution of SEM images is more complicated than deconvolution of optical images. For instance, while many optical deconvolution strategies rely on the assumption that an edge can be well approximated by a step function, such assumptions do not extend to deconvoluted SEM signals because they often cannot be well approximated by step functions. The SEM signal is, for a large part, determined by the interaction volume of the electrons inside the target, making the SEM signal highly dependent on the properties of the target and the settings of the SEM. Consequently, when Wiener deconvolution is applied to deconvolve low-resolution data 820, the resulting deconvolved data (not shown) fails to conform to high-resolution data 810. The resulting deconvolved data also exhibits pronounced artifacts.

The deconvolution process configured in accordance with embodiments of the present disclosure improves the deconvolution result by taking into consideration the spatial-spectral characteristics obtained from high-resolution data 810. Relevant spatial-spectral characteristics may include phase and amplitude characteristics. Utilizing such characteristics, image enhancement system 300 may deconvolve low-resolution data 820 by checking at which spatial frequencies noise is dominating the amplitude spectrum and replacing the amplitudes and phases for these high spatial frequencies with corresponding amplitudes and phases obtained from high-resolution data 810. The resulting deconvolved data, depicted as deconvolved data 830, exhibits noises that are comparable to noises present in high-resolution data 810. Deconvolved data 830 can also eliminate pronounced artifacts produced by Wiener deconvolution and better conforms to ideal high-resolution data.

It is contemplated that the numerical compensation process configured in accordance with embodiments of the present disclosure may be applied in a frequency domain. In some embodiments, image enhancement system 300 may utilize Fourier transformations to transform SEM signals that are in a time domain to a frequency domain (may also be referred to as Fourier domain) prior to applying numerical compensations. It is to be understood, however, that image enhancement system 300 may also be configured to apply numerical compensations in a time domain. It is to be understood that specific implementations of image enhancement system 300 may vary without departing from the scope and spirt of the present disclosure.

In some embodiments, image enhancement system 300 may be further configured to focus the inspection on certain features, such as edge positions and the like. In such embodiments, rather than attempting to enhance the image quality of an entire low-resolution inspection image, image enhancement system 300 may focus its enhancement on a few features or areas of interest. It is contemplated that by focusing its enhancement on a few features or areas of interest, image enhancement system 300 may further improve its accuracy and throughput.

FIG. 9 is a flow chart illustrating an exemplary image enhancement method that can be performed by an image enhancement system (e.g., image enhancement system 300 of FIG. 3) to help identify the existence and the positions of features or areas of interest.

In step 910, one or more scanned images of an inspection area may be acquired. At least one of the images may include a high-resolution image (e.g., high-resolution image 310 of FIG. 4) and at least one of the images may include a low-resolution inspection image (e.g., low-resolution inspection image 330 of FIG. 4). For illustrative purposes, the high-resolution image may be referred to as a first image (or first SEM image) and the low-resolution inspection image may be referred to as a second image (or second SEM image). It is to be understood that the terms "first" and "second" do not suggest that the first image needs to be acquire before the second image. It is contemplated that the first image and the second image may be acquired simultaneously (e.g., the first image may be acquired using an on-axis beam of a multi-beam system and the second image may be acquired using an off-axis beam of that multi-beam system) or sequentially (e.g., the first image may be acquired before the second image, or vice versa).

In step 920, the image enhancement system may analyze data representing the first image to recognize one or more features contained therein. For example, with reference to FIG. 10, image enhancement system 300 may analyze high-resolution data 1010 representing the first image (or a portion of the first image) to recognize an edge feature contained in the first image. Alternatively, or additionally, image enhancement system 300 may feed high-resolution data 1010 to machine learning network 320, which may be configured to recognize such a feature contained in the first image.

In step 930, the image enhancement system may numerically blur the data representing the first image to simulate data representing a blurred image acquired at a lower resolution. For example, with reference to FIG. 10, image enhancement system 300 may numerically blur high-resolution data 1010 representing the first image (or a portion of the first image) to produce simulated low-resolution data 1020. More specifically, to numerically blur high-resolution data 1010, image enhancement system 300 may convolve high-resolution data 1010 with a beam profile similar to the beam used to acquire low-resolution data 1030. For example, if it is known that the beam used to acquire low-resolution data 1030 is of a particular size, has a particular current level, or has a particular beam position, that information can be utilized to create a beam profile, which can then be utilized to numerically blur high-resolution data 1010 in an effort to simulate what would have been acquired using a beam of that particular size, having that particular current level, and being located at that particular position. On the other hand, if the beam profile is not explicitly known, image enhancement system 300 may utilize machine learning network 320 to analyze the high-resolution data and the low-resolution data acquired in the past to help determine how blurring should be applied. It is contemplated that the utilization of machine learning network 320 in this manner may cause a slight delay, but the delay is negligible in comparison to the increased throughput. In case of a multi-beam system in which an on-axis beam is used to provide the high-resolution images, image enhancement system 300 may be able to validate or update machine learning network 320 during the inspection process without causing any noticeable delays.

Referring back to FIG. 9, in step 940, the image enhancement system may determine whether a portion of the simulated low-resolution data representing the blurred image fits a portion of the data representing the second image. For example, with reference to FIG. 10, image enhancement system 300 may compare simulated low-resolution data 1020 against acquired low-resolution data 1030 to determine whether there is a fit. In some embodiments, the determination that a portion of simulated low-resolution data 1020 fits a portion of low-resolution data 1030 is made based on a cross-correlation between the portion of simulated low-resolution data 1020 and the portion of low-resolution data 1030. In some embodiments, the determination that a portion of simulated low-resolution data 1020 fits a portion of low-resolution data 1030 is made based on a root mean square of the portion of simulated low-resolution data 1020 and a root mean square of the portion of low-resolution data 1030. It is contemplated that other data fitting processes may also be utilized to make the determination without departing from the scope and spirt of the present disclosure.

Referring back to FIG. 9, in step 950, in response to the determination that a portion of the simulated low-resolution data representing the blurred image fits a portion of the data representing the second image, the image enhancement system may recognize the portion of the data representing the second image as an area of interest because it contains the recognized feature (e.g., an edge position in the example presented above). Based on this recognition, the image enhancement system may, in step 960, choose to enhance image qualities of the second image for areas that have been recognized as being of interest. In this manner, image enhancement system 300 may focus its enhancement on a few features or areas of interest, further improving its accuracy and throughput.

Enhanced images may be used for inspection, defect identification and analysis, process verification, quality control, yield improvement analysis, etc. in real-time while maintaining the high throughput required during the inspection steps in a wafer fabrication process. Enhanced images may be displayed on multiple displays simultaneously. For example, enhanced images representing inspection images of a wafer after the photoresist strip step but prior to the following metal deposition step may be reviewed by multiple reviewers or multiple users requesting the information. In some embodiments, enhanced images may be retrieved by a user prompt at a later time for review and in-depth analysis. Enhanced images may be stored in a suitable format, for example, a JPEG file, a PNG file, a PDF file, a TIFF file, etc.

The embodiments may further be described using the following first set of clauses, wherein references to other clauses are references to clauses of this first set of clauses:

1. A method for enhancing an image, the method comprising:
    acquiring a first image of a sample;
    extracting pattern information of the first image;
    identifying trained features using the pattern information; and
    providing an enhanced image from the first image using the identified trained features.

2. The method of clause 1, further comprising acquiring a training image from a user-defined database, wherein the user-defined database comprises a graphic database system.

3. The method of any one of clauses 1 and 2, further comprising extracting the trained features, via a machine learning network, from the training image.

4. The method of any one of clauses 2 and 3, wherein acquiring the training image and extracting the trained features are performed in an offline mode.

5. The method of any one of clauses 1 to 4, wherein identifying the trained features using the pattern information includes a comparison of the pattern information and the trained features.

6. The method of any one of clauses 1 to 5, wherein the first image comprises a low-resolution e-beam inspection image.

7. The method of clause 2, wherein the training image comprises a high-resolution e-beam image.

8. A method for enhancing an image, the method comprising:
    acquiring a training image;
    extracting, via a machine learning network, trained features from the training image;
    acquiring a first image of a sample;
    extracting pattern information of the first image;
    identifying trained features using the pattern information; and providing an enhanced image from the first image using the identified trained features.

9. The method of clause 8, further comprising acquiring the training image from a user-defined database, wherein the user-defined database comprises a graphic database system.

10. The method of any one of clauses 8 and 9, wherein acquiring the training image and extracting the trained features are performed in an offline mode.

11. The method of any one of clauses 8 to 10, wherein identifying the trained features using the pattern information includes a comparison of the pattern information and the trained features.

12. The method of any one of clauses 8 to 11, wherein the first image comprises a low-resolution e-beam inspection image.

13. The method of any one of clauses 8 to 11, wherein the training image comprises a high-resolution e-beam image.

14. An inspection image enhancement system, comprising:
    a memory storing a set of instructions; and
    a processor configured to execute the set of instructions to cause the inspection image enhancement system to:
        acquire an inspection image of a sample;
        extract pattern information from the inspection image;
        identify trained features using the pattern information; and
        provide an enhanced image from the inspection image using the identified trained features.

15. The system of clause 14, wherein the set of instructions further cause the inspection image enhancement system to:
    acquire a training image; and
    extract the trained features, via a machine learning network, from the training image.

16. The system of clause 15, wherein the set of instructions further cause the inspection image enhancement system to acquire the training image and extract the trained features in an offline mode.

17. The system of any one of clauses 15 and 16, wherein the set of instructions further cause the inspection image enhancement system to acquire the training image from a user-defined database.

18. The system of any one of clauses 14 to 17, wherein the set of instructions further cause the inspection image enhancement system to identify the trained features using the pattern information by comparing the pattern information and the trained features.

19. The system of any one of clauses 14 to 18, wherein the inspection image comprises a low-resolution e-beam image.

20. The system of any one of clauses 15 to 18, wherein the training image comprises a high-resolution e-beam image.

21. The system of any one of clauses 14 to 20, further comprising a storage device configured to store data related to the trained features and the pattern information.

22. A non-transitory computer readable medium that stores a set of instructions that is executable by at least one processor of an apparatus to cause the apparatus to perform a method comprising:
    acquiring a first image of a sample;
    extracting pattern information of the first image;

identifying trained features using the pattern information; and providing an enhanced image from the first image using the identified trained features.

23. The computer readable medium of clause 22, wherein the set of instructions further cause the apparatus to perform:

acquiring a training image; and extracting the trained features, via a machine learning network, from the training image.

24. The computer readable medium of clause 24, wherein the set of instructions further cause the apparatus to perform:

acquiring the training image and extracting the trained features in an offline mode.

25. The computer readable medium of clause 22, wherein the set of instructions further cause the apparatus to perform:

identifying the trained features using the pattern information by comparing the pattern information with the trained features.

The embodiments may further be described using the following second set of clauses, wherein references to other clauses are references to clauses of this second set of clauses:

1. A method for enhancing an image, the method comprising:

acquiring a first scanning electron microscopy (SEM) image at a first resolution;

acquiring a second SEM image at a second resolution; and providing an enhanced image, the enhanced image being provided by using the first SEM image as a reference to enhance the second SEM image.

2. The method of clause 1, wherein the enhanced image is provided by using one or more features extracted from the first image to enhance the second SEM image, or using the first SEM image as a reference to numerically enhance the second SEM image.

3. The method of clause 1, further comprising:

extracting a trained feature from the first SEM image.

4. The method of clause 3, wherein the trained feature is extracted from the first SEM image using a machine learning network.

5. The method of clause 4, further comprising:

acquiring at least one additional SEM image at the first resolution; and extracting at least one additional trained feature from the at least one additional SEM image using the machine learning network.

6. The method of any one of clauses 2 to 5, further comprising:

extracting pattern information of the second SEM image;

determining that the trained feature is identified on the second SEM image using the pattern information; and in response to the determination that the trained feature is identified on the second SEM image, providing the enhanced image by enhancing the second SEM image using the identified trained feature.

7. The method of any one of clauses 2 to 6, wherein acquiring the first SEM image and extracting the trained feature from the first SEM image are performed in an offline mode.

8. The method of any one of clauses 2 to 6, wherein determining that the trained feature is identified on the second SEM image includes a comparison of the pattern information and the trained feature.

9. The method of clause 1, further comprising:

analyzing data representing the first SEM image to obtain one or more spatial-spectral characteristics; and providing the enhanced image by applying one or more numerical compensations to data representing the second SEM image based on the one or more spatial-spectral characteristics obtained.

10. The method of clause 9, wherein the one or more spatial-spectral characteristics obtained include phase and amplitude characteristics.

11. The method of clause 9, wherein the one or more numerical compensations are applied in a Fourier domain.

12. The method of clause 9, wherein the one or more numerical compensations deconvolve the second SEM image.

13. The method of clause 1, further comprising:

analyzing data representing the first SEM image to recognize a feature in the first SEM image;

numerically blurring the data representing the first SEM image to simulate data representing a blurred SEM image acquired at the second resolution;

determining that a portion of the data representing the blurred SEM image fits a portion of data representing the second SEM image; and in response to the determination that a portion of the data representing the blurred SEM image fits a portion of the data representing the second SEM image, recognizing the portion of the data representing the second SEM image as a position containing the feature recognized in the first SEM image.

14. The method of clause 13, wherein the feature is an edge position.

15. The method of any one of clauses 13 and 14, wherein the determination that the portion of the data representing the blurred SEM image fits a portion of the data representing the second SEM image is made based on a cross-correlation between the portion of the data representing the blurred SEM image and the portion of the data representing the second SEM image.

16. The method of any one of clauses 13 to 14, wherein the determination that a portion of the data representing the blurred SEM image fits a portion of the data representing the second SEM image is made based on a root mean square of the portion of the data representing the blurred SEM image and a root mean square of the portion of the data representing the second SEM image.

17. The method of any one of clauses 1 to 16, wherein the second resolution is lower than the first resolution.

18. The method of any one of clauses 1 to 17, wherein the first resolution and the second resolution correspond to at least one of: an amount of signal averaging, a noise ratio of a SEM image frame, a pixel size, a SEM beam width of an on-axis beam of a multi-beam system, a SEM beam width of an off-axis beam of a multi-beam system, a SEM beam width of a single beam system, or a current supplied to a SEM beam.

19. The method of any one of clauses 1 to 18, wherein the first SEM image is obtained using an on-axis beam of a multi-beam system and the second SEM image is obtained using an off-axis beam of the multi-beam system.

20. The method of any one of clauses 1 to 18, wherein the first SEM image is obtained using a low-current beam and the second SEM image is obtained using a high-current beam.

21. An inspection system, comprising:
a memory storing a set of instructions; and
a processor configured to execute the set of instructions to cause the inspection system to:
acquire a first scanning electron microscopy (SEM) image at a first resolution;
acquire a second SEM image at a second resolution; and
provide an enhanced image, the enhanced image being provided by using the first SEM image as a reference to enhance the second SEM image.

22. The system of clause 21, wherein the enhanced image is provided by using one or more features extracted from the first image to enhance the second SEM image, or using the first SEM image as a reference to numerically enhance the second SEM image.

23. The system of clause 21, wherein the processor is further configured to execute the set of instructions to cause the inspection system to:
extract a trained feature from the first SEM image.

24. The system of clause 23, wherein the trained feature is extracted from the first SEM image using a machine learning network.

25. The system of clause 24, wherein the processor is further configured to execute the set of instructions to cause the inspection system to:
acquire at least one additional SEM image at the first resolution; and
extract at least one additional trained feature from the at least one additional SEM image using the machine learning network.

26. The system of any one of clause 22 to 25, wherein the processor is further configured to execute the set of instructions to cause the inspection system to:
extract pattern information of the second SEM image;
determine that the trained feature is identified on the second SEM image using the pattern information; and
in response to the determination that the trained feature is identified on the second SEM image, provide the enhanced image by enhancing the second SEM image using the identified trained feature.

27. The system of any one of clauses 22 to 26, wherein the processor is further configured to execute the set of instructions to cause the inspection system to acquire the first SEM image and extract the trained feature from the first SEM image in an offline mode.

28. The system of clause 26, wherein the determination that the trained feature is identified on the second SEM image includes a comparison of the pattern information and the trained feature.

29. The system of clause 21, wherein the processor is further configured to execute the set of instructions to cause the inspection system to:
analyze data representing the first SEM image to obtain one or more spatial-spectral characteristics; and
provide the enhanced image by applying one or more numerical compensations to data representing the second SEM image based on the one or more spatial-spectral characteristics obtained.

30. The system of clause 29, wherein the one or more spatial-spectral characteristics obtained include phase and amplitude characteristics.

31. The system of clause 29, wherein the one or more numerical compensations are applied in a Fourier domain.

32. The system of clause 29, wherein the one or more numerical compensations deconvolve the second SEM image.

33. The system of clause 21, wherein the processor is further configured to execute the set of instructions to cause the inspection system to:
analyze data representing the first SEM image to recognize a feature in the first SEM image;
numerically blur the data representing first SEM image to simulate data representing a blurred SEM image acquired at the second resolution;
determine that a portion of the data representing the blurred SEM image fits a portion of data representing the second SEM image; and
in response to the determination that a portion of the data representing the blurred SEM image fits a portion of the data representing the second SEM image, recognize the portion of the data representing the second SEM image as a position containing the feature recognized in the first SEM image.

34. The system of clause 33, wherein the feature is an edge position.

35. The system of any one of clauses 33 to 34, wherein the determination that the portion of the data representing the blurred SEM image fits a portion of the data representing the second SEM image is made based on a cross-correlation between the portion of the data representing the blurred SEM image and the portion of the data representing the second SEM image.

36. The system of any one of clauses 33 to 34, wherein the determination that the portion of the data representing the blurred SEM image fits a portion of the data representing the second SEM image is made based on a root mean square of the portion of the data representing the blurred SEM image and a root mean square of the portion of the data representing the second SEM image.

37. The system of any one of clauses 21 to 36, wherein the second resolution is lower than the first resolution.

38. The system of any one of clauses 21 to 37, wherein the first resolution and the second resolution correspond to at least one of: an amount of signal averaging, a noise ratio of a SEM image frame, a pixel size, a SEM beam width of an on-axis beam of a multi-beam system, a SEM beam width of an off-axis beam of a multi-beam system, a SEM beam width of a single beam system, or a current supplied to a SEM beam.

39. The system of any one of clauses 21 to 38, wherein the first SEM image is obtained using an on-axis beam of a multi-beam system and the second SEM image is obtained using an off-axis beam of the multi-beam system.

40. The system of any one of clauses 21 to 38, wherein the first SEM image is obtained using a low-current beam and the second SEM image is obtained using a high-current beam.

41. A non-transitory computer readable medium that stores a set of instructions that is executable by at least one processor of an apparatus to cause the apparatus to perform a method comprising:
acquiring a first scanning electron microscopy (SEM) image at a first resolution;
acquiring a second SEM image at a second resolution; and providing an enhanced image, the enhanced image being provided by using the first SEM image as a reference to enhance the second SEM image.

42. The computer readable medium of clause 41, wherein the enhanced image is provided by using one or more features extracted from the first image to enhance the second SEM image, or using the first SEM image as a reference to numerically enhance the second SEM image.

43. The computer readable medium of clause 41, wherein the set of instructions that is executable by at least one processor of the apparatus to cause the apparatus to further perform:

extracting a trained feature from the first SEM image.

44. The computer readable medium of clause 43, wherein the trained feature is extracted from the first SEM image using a machine learning network.

45. The computer readable medium of clause 44, wherein the set of instructions that is executable by at least one processor of the apparatus to cause the apparatus to further perform:

acquiring at least one additional SEM image at the first resolution; and extracting at least one additional trained feature from the at least one additional SEM image using the machine learning network.

46. The computer readable medium of any one of clauses 42 to 45, wherein the set of instructions that is executable by at least one processor of the apparatus to cause the apparatus to further perform:

extracting pattern information of the second SEM image;

determining that the trained feature is identified on the second SEM image using the pattern information; and in response to the determination that the trained feature is identified on the second SEM image, providing the enhanced image by enhancing the second SEM image using the identified trained feature.

47. The computer readable medium of any one of clauses 42 to 46, wherein acquiring the first SEM image and extracting the trained feature from the first SEM image are performed in an offline mode.

48. The computer readable medium of clause 46, wherein determining that the trained feature is identified on the second SEM image includes a comparison of the pattern information and the trained feature.

49. The computer readable medium of clause 41, wherein the set of instructions that is executable by at least one processor of the apparatus to cause the apparatus to further perform:

analyzing data representing the first SEM image to obtain one or more spatial-spectral characteristics; and providing the enhanced image by applying one or more numerical compensations to data representing the second SEM image based on the one or more spatial-spectral characteristics obtained.

50. The computer readable medium of clause 49, wherein the one or more spatial-spectral characteristics obtained include phase and amplitude characteristics.

51. The computer readable medium of clause 49, wherein the one or more numerical compensations are applied in a Fourier domain.

52. The computer readable medium of clause 49, wherein the one or more numerical compensations deconvolve the second SEM image.

53. The computer readable medium of clause 41, wherein the set of instructions that is executable by at least one processor of the apparatus to cause the apparatus to further perform:

analyzing data representing the first SEM image to recognize a feature in the first SEM image;

numerically blurring the data representing first SEM image to simulate data representing a blurred SEM image acquired at the second resolution;

determining that a portion of the data representing the blurred SEM image fits a portion of data representing the second SEM image; and in response to the determination that a portion of the data representing the blurred SEM image fits a portion of the data representing the second SEM image, recognizing the portion of the data representing the second SEM image as a position containing the feature recognized in the first SEM image.

54. The computer readable medium of clause 53, wherein the feature is an edge position.

55. The computer readable medium of any one of clauses 53 to 54, wherein the determination that a portion of the data representing the blurred SEM image fits a portion of the data representing the second SEM image is made based on a cross-correlation between the portion of the data representing the blurred SEM image and the portion of the data representing the second SEM image.

56. The computer readable medium of any one of clauses 53 to 54, wherein the determination that a portion of the data representing the blurred SEM image fits a portion of the data representing the second SEM image is made based on a root mean square of the portion of the data representing the blurred SEM image and a root mean square of the portion of the data representing the second SEM image.

57. The computer readable medium of any one of clauses 41 to 56, wherein the second resolution is lower than the first resolution.

58. The computer readable medium of any one of clauses 41 to 57, wherein the first resolution and the second resolution correspond to at least one of: an amount of signal averaging, a noise ratio of a SEM image frame, a pixel size, a SEM beam width of an on-axis beam of a multi-beam system, a SEM beam width of an off-axis beam of a multi-beam system, a SEM beam width of a single beam system, or a current supplied to a SEM beam.

59. The computer readable medium of any one of clauses 41 to 58, wherein the first SEM image is obtained using an on-axis beam of a multi-beam system and the second SEM image is obtained using an off-axis beam of the multi-beam system.

60. The computer readable medium of any one of clauses 41 to 58, wherein the first SEM image is obtained using a low-current beam and the second SEM image is obtained using a high-current beam.

The embodiments may further be described using the following third set of clauses, wherein references to other clauses are references to clauses of this third set of clauses:

1. A method for enhancing an image, the method comprising:

acquiring a first scanning electron microscopy (SEM) image by use of an on-axis beam of a multi-beam system;

acquiring a second SEM image by use of an off-axis beam of the multi-beam system; and providing an enhanced image, the enhanced image being provided by using the first SEM image as a reference to enhance the second SEM image.

2. The method of clause 1, wherein the enhanced image is provided by using one or more features extracted from the first image to enhance the second SEM image, or using the first SEM image as a reference to numerically enhance the second SEM image.

3. The method of clause 1, further comprising: extracting a trained feature from the first SEM image.

4. An inspection system, comprising:
a memory storing a set of instructions; and
a processor configured to execute the set of instructions to cause the inspection system to:
acquire a first scanning electron microscopy (SEM) image by use of an on-axis beam of a multi-beam system;
acquire a second SEM image by use of an off-axis beam of the multi-beam system; and
provide an enhanced image, the enhanced image being provided by using the first SEM image as a reference to enhance the second SEM image.

5. The system of clause 4, wherein the enhanced image is provided by using one or more features extracted from the first image to enhance the second SEM image, or using the first SEM image as a reference to numerically enhance the second SEM image.

6. The system of clause 4, wherein the processor is further configured to execute the set of instructions to cause the inspection system to:
extract a trained feature from the first SEM image.

7. The system of clause 6, wherein the trained feature is extracted from the first SEM image using a machine learning network.

8. The system of clause 7, wherein the processor is further configured to execute the set of instructions to cause the inspection system to:
acquire at least one additional SEM image by use of the on-axis beam; and
extract at least one additional trained feature from the at least one additional SEM image using the machine learning network.

9. The system of clause 4, wherein the processor is further configured to execute the set of instructions to cause the inspection system to:
extract pattern information of the second SEM image;
determine that the trained feature is identified on the second SEM image using the pattern information; and
in response to the determination that the trained feature is identified on the second SEM image, provide the enhanced image by enhancing the second SEM image using the identified trained feature.

10. The system of clause 4, wherein the processor is further configured to execute the set of instructions to cause the inspection system to acquire the first SEM image and extract the trained feature from the first SEM image in an offline mode.

11. The system of clause 9, wherein the determination that the trained feature is identified on the second SEM image includes a comparison of the pattern information and the trained feature.

12. The system of clause 4, wherein the processor is further configured to execute the set of instructions to cause the inspection system to:
analyze data representing the first SEM image to obtain one or more spatial-spectral characteristics; and provide the enhanced image by applying one or more numerical compensations to data representing the second SEM image based on the one or more spatial-spectral characteristics obtained.

13. The system of clause 12, wherein the one or more spatial-spectral characteristics obtained include phase and amplitude characteristics.

14. The system of clause 12, wherein the one or more numerical compensations are applied in a Fourier domain.

15. The system of clause 12, wherein the one or more numerical compensations deconvolve the second SEM image.

A non-transitory computer readable medium may be provided that stores instructions for a processor (for example, processor of controller 109 of FIG. 1) to carry out image processing, data processing, database management, graphical display, operations of a charged particle beam apparatus, or other imaging device, etc. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

The block diagrams in the figures illustrate the architecture, functionality, and operation of possible implementations of systems, methods, and computer hardware or software products according to various exemplary embodiments of the present disclosure. In this regard, each block in a flowchart or block diagram may represent a module, segment, or portion of code, which comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes may be made without departing from the scope thereof.

What is claimed is:

1. A method for enhancing an image, the method comprising:
scanning a wafer simultaneously using an on-axis beam and at least one off-axis beam of a multi-beam system;
acquiring a first scanning electron microscopy (SEM) image by use of the on-axis beam of the multi-beam system;
acquiring a second SEM image by use of the at least one off-axis beam of the multi-beam system, wherein the first SEM image acquired via the on-axis beam has a higher resolution than the second SEM image acquired via the at least one off-axis beam; and providing an enhanced image, the enhanced image being provided by using the first SEM image as a reference to numerically enhance the second SEM image, wherein numerically enhancing the second SEM image comprises numerically blurring data representing the first SEM image to match data representing the second SEM image.

2. The method of claim 1, wherein the enhanced image is provided by using one or more features extracted from the first SEM image to enhance the second SEM image.

3. The method of claim 1, further comprising:

extracting a trained feature from the first SEM image.

4. The method of claim 1, further comprising recognizing one or more features in the second SEM image as corresponding one or more features in the first SEM image based on a comparison between the numerically blurred data and the data representing the second SEM image.

5. An inspection system, comprising:

a memory storing a set of instructions; and a processor configured to execute the set of instructions to cause the inspection system to:

scan a wafer simultaneously using an on-axis beam and at least one off-axis beam of a multi-beam system;

acquire a first scanning electron microscopy (SEM) image by use of the on-axis beam of the multi-beam system;

acquire a second SEM image by use of the at least one off-axis beam of the multi-beam system, wherein the first SEM image acquired via the on-axis beam has a higher resolution than the second SEM image acquired via the at least one off-axis beam; and provide an enhanced image, the enhanced image being provided by using the first SEM image as a reference to numerically enhance the second SEM image by numerically blurring data representing the first SEM image to match data representing the second SEM image.

6. The system of claim 5, wherein the enhanced image is provided by using one or more features extracted from the first SEM image to enhance the second SEM image.

7. The system of claim 5, wherein the processor is further configured to execute the set of instructions to cause the inspection system to:

extract a trained feature from the first SEM image.

8. The system of claim 7, wherein the trained feature is extracted from the first SEM image using a machine learning network.

9. The system of claim 8, wherein the processor is further configured to execute the set of instructions to cause the inspection system to:

acquire at least one additional SEM image by use of the on-axis beam; and extract at least one additional trained feature from the at least one additional SEM image using the machine learning network.

10. The system of claim 7, wherein the processor is further configured to execute the set of instructions to cause the inspection system to:

extract pattern information of the second SEM image;

determine that the trained feature is identified on the second SEM image using the pattern information; and in response to the determination that the trained feature is identified on the second SEM image, provide the enhanced image by enhancing the second SEM image using the identified trained feature.

11. The system of claim 7, wherein the processor is further configured to execute the set of instructions to cause the inspection system to acquire the first SEM image and extract the trained feature from the first SEM image in an offline mode.

12. The system of claim 10, wherein the determination that the trained feature is identified on the second SEM image includes a comparison of the pattern information and the trained feature.

13. The system of claim 5, wherein the processor is further configured to execute the set of instructions to cause the inspection system to:

analyze data representing the first SEM image to obtain one or more spatial-spectral characteristics; and provide the enhanced image by applying one or more numerical compensations to data representing the second SEM image on the one or more spatial-spectral characteristics obtained.

14. The system of claim 13, wherein the one or more spatial-spectral characteristics obtained include phase and amplitude characteristics.

15. The system of claim 13, wherein the one or more numerical compositions are applied in a Fourier domain.

16. The system of claim 13, wherein the one or more numerical compensations deconvolve the second SEM image.

17. The system of claim 5, wherein the processor is further configured to execute the set of instructions to cause the inspection system to recognize one or more features in the second SEM image as corresponding one or more features in the first SEM image based on a comparison between the numerically blurred data and the data representing the second SEM image.

* * * * *